(12) United States Patent  
Okhonin et al.

(10) Patent No.: US 7,476,939 B2  
(45) Date of Patent: Jan. 13, 2009

(54) MEMORY CELL HAVING AN ELECTRICALLY FLOATING BODY TRANSISTOR AND PROGRAMMING TECHNIQUE THEREFOR

(75) Inventors: Serguei Okhonin, Lausanne (CH); Mikhail Nagoga, Pully (CH)

(73) Assignee: Innovative Silicon ISi Sa, Lausanne (CH)

( * ) Notice: Subject to any disclaimer, the term of this patent is extended or adjusted under 35 U.S.C. 154(b) by 25 days.

(21) Appl. No.: 11/247,727

(22) Filed: Oct. 11, 2005

(65) Prior Publication Data

US 2006/0091462 A1    May 4, 2006

Related U.S. Application Data

(60) Provisional application No. 60/625,248, filed on Nov. 4, 2004.

(51) Int. Cl.  
*H01L 27/12* (2006.01)

(52) U.S. Cl. .................. 257/347; 257/341; 257/354; 257/66; 257/67; 365/185.14; 365/185.04; 365/185.25; 365/185.26

(58) Field of Classification Search ......... 438/197–199, 438/243, 386, 242; 257/301–302, 347, 316, 257/341, 354, 66, 67; 365/185.14  
See application file for complete search history.

(56) References Cited

U.S. PATENT DOCUMENTS

| 3,439,214 A | 4/1969 | Kabell |
| 3,997,799 A | 12/1976 | Baker |
| 4,032,947 A | 6/1977 | Kesel et al. |
| 4,250,569 A | 2/1981 | Sasaki et al. |
| 4,262,340 A | 4/1981 | Sasaki et al. |
| 4,298,962 A | 11/1981 | Hamano et al. |
| 4,371,955 A | 2/1983 | Sasaki |
| 4,527,181 A | 7/1985 | Sasaki |
| 4,630,089 A | 12/1986 | Sasaki et al. |
| 4,791,610 A | 12/1988 | Takemae |

(Continued)

FOREIGN PATENT DOCUMENTS

EP    0 030 856    6/1981

(Continued)

OTHER PUBLICATIONS

"Scalability Study on a Capacitorless 1T-DRAM: From Single-gate PD-SOI to Double-gate FinDRAM", Tanaka et al., 2004 IEEE, 4 pages.

(Continued)

*Primary Examiner*—Zandra V. Smith  
*Assistant Examiner*—Tsz K Chiu  
(74) *Attorney, Agent, or Firm*—Neil A. Steinberg

(57) ABSTRACT

A memory cell comprising an electrically floating body transistor including a source region, a drain region, a body region disposed therebetween, wherein the body region is electrically floating, and a gate disposed over the body region and separated therefrom by a gate dielectric. The memory cell includes a first data state representative of a first charge in the body region and a second data state representative of a second charge in the body region wherein the second charge is substantially provided by removing carriers from the body region through the gate. Thus, a memory cell may be programmed to a logic low by, for example, causing, forcing and/or inducing carriers in the floating body of the transistor to tunnel through or traverse the gate dielectric to the gate of the electrically floating body transistor (and, in many array configurations, the word line of a memory cell array).

26 Claims, 12 Drawing Sheets

U.S. PATENT DOCUMENTS

| | | |
|---|---|---|
| 4,954,989 A | 9/1990 | Auberton-Herve et al. |
| 4,979,014 A | 12/1990 | Hieda et al. |
| 5,144,390 A | 9/1992 | Matloubian |
| 5,258,635 A | 11/1993 | Nitayama et al. |
| 5,388,068 A | 2/1995 | Ghoshal et al. |
| 5,446,299 A | 8/1995 | Acovic et al. |
| 5,448,513 A | 9/1995 | Hu et al. |
| 5,466,625 A | 11/1995 | Hsieh et al. |
| 5,489,792 A | 2/1996 | Hu et al. |
| 5,528,062 A | 6/1996 | Hsieh et al. |
| 5,568,356 A | 10/1996 | Schwartz |
| 5,593,912 A | 1/1997 | Rajeevakumar |
| 5,606,188 A | 2/1997 | Bronner et al. |
| 5,627,092 A | 5/1997 | Alsmeier et al. |
| 5,631,186 A | 5/1997 | Park et al. |
| 5,696,718 A | 12/1997 | Hartmann |
| 5,740,099 A | 4/1998 | Tanigawa |
| 5,778,243 A | 7/1998 | Aipperspach et al. |
| 5,780,906 A | 7/1998 | Wu et al. |
| 5,784,311 A | 7/1998 | Assaderaghi et al. |
| 5,811,283 A | 9/1998 | Sun |
| 5,877,978 A | 3/1999 | Morishita et al. |
| 5,886,376 A | 3/1999 | Acovic et al. |
| 5,886,385 A | 3/1999 | Arisumi et al. |
| 5,897,351 A | 4/1999 | Forbes |
| 5,929,479 A | 7/1999 | Oyama |
| 5,930,648 A | 7/1999 | Yang |
| 5,936,265 A | 8/1999 | Koga |
| 5,939,745 A | 8/1999 | Park et al. |
| 5,943,258 A | 8/1999 | Houston et al. |
| 5,943,581 A | 8/1999 | Lu et al. |
| 5,960,265 A | 9/1999 | Acovic et al. |
| 5,968,840 A | 10/1999 | Park et al. |
| 5,977,578 A | 11/1999 | Tang |
| 5,982,003 A | 11/1999 | Hu et al. |
| 6,018,172 A | 1/2000 | Hidada et al. |
| 6,081,443 A | 6/2000 | Morishita |
| 6,096,598 A | 8/2000 | Furukawa et al. |
| 6,097,056 A | 8/2000 | Hsu et al. |
| 6,111,778 A | 8/2000 | MacDonald et al. |
| 6,121,077 A | 9/2000 | Hu et al. |
| 6,157,216 A | 12/2000 | Lattimore et al. |
| 6,171,923 B1 | 1/2001 | Chi et al. |
| 6,177,300 B1 | 1/2001 | Houston et al. |
| 6,177,708 B1 | 1/2001 | Kuang et al. |
| 6,214,694 B1 | 4/2001 | Leobandung et al. |
| 6,225,158 B1 | 5/2001 | Furukawa et al. |
| 6,245,613 B1 | 6/2001 | Hsu et al. |
| 6,252,281 B1 | 6/2001 | Yamamoto et al. |
| 6,292,424 B1 | 9/2001 | Ohsawa |
| 6,297,090 B1 | 10/2001 | Kim |
| 6,300,649 B1 | 10/2001 | Hu et al. |
| 6,320,227 B1 | 11/2001 | Lee et al. |
| 6,333,532 B1 | 12/2001 | Davari et al. |
| 6,350,653 B1 | 2/2002 | Adkisson et al. |
| 6,351,426 B1 | 2/2002 | Ohsawa |
| 6,359,802 B1 | 3/2002 | Lu et al. |
| 6,384,445 B1 | 5/2002 | Hidaka et al. |
| 6,391,658 B1 | 5/2002 | Gates et al. |
| 6,403,435 B1 | 6/2002 | Kang et al. |
| 6,421,269 B1 | 7/2002 | Somasekhar et al. |
| 6,424,011 B1 | 7/2002 | Assaderaghi et al. |
| 6,424,016 B1 | 7/2002 | Houston |
| 6,429,477 B1 | 8/2002 | Mandelman et al. |
| 6,440,872 B1 | 8/2002 | Mandelman et al. |
| 6,441,435 B1 | 8/2002 | Chan |
| 6,441,436 B1 | 8/2002 | Wu et al. |
| 6,466,511 B2 | 10/2002 | Fujita et al. |
| 6,492,211 B1 | 12/2002 | Divakaruni et al. |
| 6,518,105 B1 | 2/2003 | Yang et al. |
| 6,531,754 B1 | 3/2003 | Nagano et al. |
| 6,538,916 B2 | 3/2003 | Ohsawa |
| 6,544,837 B1 | 4/2003 | Divakaruni et al. |
| 6,548,848 B2 | 4/2003 | Horiguchi et al. |
| 6,549,450 B1 | 4/2003 | Hsu et al. |
| 6,552,398 B2 | 4/2003 | Hsu et al. |
| 6,556,477 B2 | 4/2003 | Hsu et al. |
| 6,566,177 B1 | 5/2003 | Radens et al. |
| 6,567,330 B2 | 5/2003 | Fujita et al. |
| 6,590,258 B2 | 7/2003 | Divakauni et al. |
| 6,590,259 B2 | 7/2003 | Adkisson et al. |
| 6,617,651 B2 | 9/2003 | Ohsawa |
| 6,621,725 B2 | 9/2003 | Ohsawa |
| 6,632,723 B2 | 10/2003 | Watanabe et al. |
| 6,650,565 B1 | 11/2003 | Ohsawa |
| 6,930,918 B2 * | 8/2005 | Fazan et al. ............ 365/185.14 |
| 6,937,516 B2 * | 8/2005 | Fazan et al. ............ 365/185.14 |
| 7,061,806 B2 | 6/2006 | Tang et al. |
| 2001/0055859 A1 | 12/2001 | Yamada et al. |
| 2002/0030214 A1 | 3/2002 | Horiguchi |
| 2002/0034855 A1 | 3/2002 | Horiguchi et al. |
| 2002/0036322 A1 | 3/2002 | Divakauni et al. |
| 2002/0051378 A1 | 5/2002 | Ohsawa |
| 2002/0064913 A1 | 5/2002 | Adkisson et al. |
| 2002/0070411 A1 | 6/2002 | Vermandel et al. |
| 2002/0072155 A1 | 6/2002 | Liu et al. |
| 2002/0076880 A1 | 6/2002 | Yamada et al. |
| 2002/0086463 A1 | 7/2002 | Houston et al. |
| 2002/0089038 A1 | 7/2002 | Ning |
| 2002/0098643 A1 | 7/2002 | Kawanaka et al. |
| 2002/0110018 A1 | 8/2002 | Ohsawa |
| 2002/0114191 A1 | 8/2002 | Iwata et al. |
| 2002/0130341 A1 | 9/2002 | Horiguchi et al. |
| 2002/0160581 A1 | 10/2002 | Watanabe et al. |
| 2002/0180069 A1 | 12/2002 | Houston |
| 2003/0003608 A1 | 1/2003 | Arikado et al. |
| 2003/0015757 A1 | 1/2003 | Ohsawa |
| 2003/0035324 A1 | 2/2003 | Fujita et al. |
| 2003/0057487 A1 | 3/2003 | Yamada et al. |
| 2003/0057490 A1 | 3/2003 | Nagano et al. |
| 2003/0102497 A1 | 6/2003 | Fried et al. |
| 2003/0112659 A1 | 6/2003 | Ohsawa |
| 2003/0123279 A1 | 7/2003 | Aipperspach et al. |
| 2003/0146488 A1 | 8/2003 | Nagano et al. |
| 2003/0151112 A1 | 8/2003 | Yamada et al. |
| 2005/0179079 A1 * | 8/2005 | Wu ............................ 257/316 |
| 2005/0195680 A1 | 9/2005 | Higashi et al. |
| 2005/0226070 A1 | 10/2005 | Ohsawa |
| 2005/0232043 A1 | 10/2005 | Ohsawa |

FOREIGN PATENT DOCUMENTS

| | | |
|---|---|---|
| EP | 0 350 057 | 1/1990 |
| EP | 0 354 348 | 2/1990 |
| EP | 0 362 961 | 4/1990 |
| EP | 0 202 515 | 3/1991 |
| EP | 0 207 619 | 8/1991 |
| EP | 0 175 378 | 11/1991 |
| EP | 0 253 631 | 4/1992 |
| EP | 0 513 923 | 11/1992 |
| EP | 0 300 157 | 5/1993 |
| EP | 0 564 204 | 10/1993 |
| EP | 0 579 566 | 1/1994 |
| EP | 0 362 961 | 2/1994 |
| EP | 0 599 506 | 6/1994 |
| EP | 0 359 551 | 12/1994 |
| EP | 0 642 173 | 3/1995 |
| EP | 0 366 882 | 5/1995 |
| EP | 0 465 961 | 8/1995 |
| EP | 0 694 977 | 1/1996 |
| EP | 0 333 426 | 7/1996 |
| EP | 0 727 820 | 8/1996 |
| EP | 0 739 097 | 10/1996 |
| EP | 0 245 515 | 4/1997 |

| | | |
|---|---|---|
| EP | 0 788 165 | 8/1997 |
| EP | 0 801 427 | 10/1997 |
| EP | 0 510 607 | 2/1998 |
| EP | 0 537 677 | 8/1998 |
| EP | 0 858 109 | 8/1998 |
| EP | 0 860 878 | 8/1998 |
| EP | 0 869 511 | 10/1998 |
| EP | 0 878 804 | 11/1998 |
| EP | 0 920 059 | 6/1999 |
| EP | 0 924 766 | 6/1999 |
| EP | 0 727 822 | 8/1999 |
| EP | 0 933 820 | 8/1999 |
| EP | 0 951 072 | 10/1999 |
| EP | 0 971 360 | 1/2000 |
| EP | 0 980 101 | 2/2000 |
| EP | 0 601 590 | 4/2000 |
| EP | 0 993 037 | 4/2000 |
| EP | 0 836 194 | 5/2000 |
| EP | 0 599 388 | 8/2000 |
| EP | 0 689 252 | 8/2000 |
| EP | 0 606 758 | 9/2000 |
| EP | 0 682 370 | 9/2000 |
| EP | 1 073 121 | 1/2001 |
| EP | 0 726 601 | 9/2001 |
| EP | 0 731 972 | 11/2001 |
| EP | 1 162 663 | 12/2001 |
| EP | 1 162 744 | 12/2001 |
| EP | 1 179 850 | 2/2002 |
| EP | 1 180 799 | 2/2002 |
| EP | 1 191 596 | 3/2002 |
| EP | 1 204 146 | 5/2002 |
| EP | 1 204 147 | 5/2002 |
| EP | 1 209 747 | 5/2002 |
| EP | 0 744 772 | 8/2002 |
| EP | 1 233 454 | 8/2002 |
| EP | 0 725 402 | 9/2002 |
| EP | 1 237 193 | 9/2002 |
| EP | 1 241 708 | 9/2002 |
| EP | 1 253 634 | 10/2002 |
| EP | 0 844 671 | 11/2002 |
| EP | 1 280 205 | 1/2003 |
| EP | 1 288 955 | 3/2003 |
| FR | 2 197 494 | 3/1974 |
| GB | 1 414 228 | 11/1975 |
| JP | S62-007149 A | 1/1987 |
| JP | 62-272561 | 11/1987 |
| JP | 02-294076 | 2/1991 |
| JP | 03171768 | 7/1991 |
| JP | H04-176163 A | 6/1992 |
| JP | 08213624 | 8/1996 |
| JP | H08-213624 A | 8/1996 |
| JP | 8-274277 | 10/1996 |
| JP | H08-316337 A | 11/1996 |
| JP | 09046688 | 2/1997 |
| JP | 9-82912 | 3/1997 |
| JP | 10242470 | 11/1998 |
| JP | 11-87649 | 3/1999 |
| JP | 247735 | 8/2000 |
| JP | 274221 | 9/2000 |
| JP | 389106 | 12/2000 |
| JP | 180633 | 6/2001 |
| JP | 2002-94027 | 3/2002 |
| JP | 2002-176154 | 6/2002 |
| JP | 2002-246571 | 8/2002 |
| JP | 2002-0981 | 11/2002 |
| JP | 2002-329795 | 11/2002 |
| JP | 2002-343886 | 11/2002 |
| JP | 2002-353080 | 12/2002 |
| JP | 2003-31693 | 1/2003 |
| JP | 2003-68877 A | 3/2003 |
| JP | 2003-86712 | 3/2003 |
| JP | 2003-100641 | 4/2003 |
| JP | 2003-100900 | 4/2003 |
| JP | 2003-132682 | 5/2003 |
| JP | 2003-203967 | 7/2003 |
| JP | 2003-243528 | 8/2003 |

OTHER PUBLICATIONS

"A Design of a Capacitorless 1-T-DRAM Cell Using Gate-induced Drain Leakage (GIDL) Current for Low-Power and High-speed Embedded Memory", Yoshida et al., 2003 IEEE, 4 pages.

"A Study of High Scalable DG-FinDRAM", Yoshida et al., IEEE Electron Device Letters, vol. 26, No. 9, Sep. 2005, pp. 655-657.

"Novel Capacitorless 1T-DRAM From Single-gate PD-SOI to Double-gate FinDRAM", ATIP Scoops, May 9, 2005, 9 pages.

"An SOI voltage-controlled bipolar-MOS device", J.P. Colinge, IEEE Transactions on Electron Devices, vol. ED-34, No. 4, Apr. 1987, pp. 845-849.

"Floating-Body Concerns for SOI Dynamic Random Access Memory (DRAM)", Mandelman et al, Proceedings 1996 IEEE International SOI Conference, Oct. 1996, pp. 136-137.

"Low-Voltage Transient Bipolar Effect Induced by Dynamic Floating-Body Charging in PD/SOI MOSFETs", Pelelle et al., SOI Conference, 1995, 2 pages.

"A Capacitorless Double-Gate DRAM Cell", Kuo et al., IEEE Electron Device Letters, vol. 23, No. 6, Jun. 2002, pp. 345-347.

"A Capacitorless Double-Gate DRAM Cell for High Density Applications", Kuo et al., IEEE IEDM, 2002, pp. 843-946.

"The Multi-Stable Behaviour of SOI-NMOS Transistors at Low Temperatures", Tack et al., Proc. 1988 SOS/SOI Technology Workshop (Sea Palms Resort, St. Simons Island, GA, Oct. 1988), p. 78.

"The Multistable Charge-Controlled Memory Effect in SOI MOS Transistors at Low Temperatures", Tack et al., IEEE Transactions on Electron Devices, vol. 37, No. 5, May 1990, pp. 1373-1382.

"Mechanisums of Charge Modulation in the Floating Body of Triple-Well nMOSFET Capacitor-less DRAMs", Villaret et al., Proceedings of the INFOS 2003, Insulating Films on Semiconductors, 13th Biannual Conference, Jun. 18-20, 2003, Barcelona (Spain), (4 pages).

"A Memory Using One-Transistor Gain Cell on SOI (FBC) with Performance Suitable for Embedded DRAM's", Ohsawa et al., 2003 Symposium on VLSI Circuits Digest of Technical Papers, Jun. 2003 (4 pages).

FBC (Floating Body Cell) for Embedded DRAM on SOI, Inoh et al., 2003 Symposium on VLSI Circuits Digest of Technical Papers, Jun. 2003 (2 pages).

"Toshiba's DRAM Cell Piggybacks on SOI Wafer", Y. Hara, EE Times, Jun. 2003.

"Memory Design Using a One-Transistor Gain Cell on SOI", Ohsawa et al., IEEE Journal of Solid-State Circuits, vol. 37, No. 11, Nov. 2002, pp. 1510-1522.

"Opposite Side Floating Gate SOI Flash Memory Cell", Lin et al., IEEE, Mar. 2000, pp. 12-15.

"Advanced TFT SRAM Cell Technology Using a Phase-Shift Lithography", Yamanaka et al., IEEE Transactions on Electron Devices, vol. 42, No. 7, Jul. 1995, pp. 1305-1313.

"Soft-Error Characteristics in Bipolar Memory Cells with Small Critical Charge", Idei et al., IEEE Transactions on Electron Devices, vol. 38, No. 11, Nov. 1991, pp. 2465-2471.

"An SOI 4 Transistors Self-Refresh Ultra-Low-Voltage Memory Cell", Thomas et al., IEEE, Mar. 2003, pp. 401-404.

"Design of a SOI Memory Cell", Stanojevic et al., IEEE Proc. 21st International Conference on Microelectronics (MIEL '97), vol. 1, NIS, Yugoslavis, Sep. 14-17, 1997, pp. 297-300.

"Effects of Floating Body on Double Polysilicon Partially Depleted SOI Nonvolatile Memory Cell", Chan et al., IEEE Electron Device Letters, vol. 24, No. 2, Feb. 2003, pp. 75-77.

"MOSFET Design Simplifies DRAM", P. Fazan, EE Times, May 14, 2002 (3 pages).

"One of Application of SOI Memory Cell—Memory Array", Lončar et al., IEEE Proc. 22nd International Conference on Microelectronics (MIEL 2000), vol. 2, NIŠ, Serbia, May 14-17, 2000, pp. 455-458.

"A SOI Current Memory for Analog Signal Processing at High Temperature", Portmann et al., 1999 IEEE International SOI Conference, Oct. 1999, pp. 18-19.

"Chip Level Reliability on SOI Embedded Memory", Kim et al., Proceedings 1998 IEEE International SOI Conference, Oct. 1998, pp. 135-139.

"Analysis of Floating-Body-Induced Leakage Current in 0.15 µm SOI DRAM", Terauchi et al., Proceedings 1996 IEEE International SOI Conference, Oct. 1996, pp. 139-139.

"Programming and Erase with Floating-Body for High Density Low Voltage Flash EEPROM Fabricated on SOI Wafers", Chi et al., Proceedings 1995 IEEE International SOI Conference, Oct. 1995, pp. 129-130.

"Measurement of Transient Effects in SOI DRAM/SRAM Access Transistors", A. Wei, IEEE Electron Device Letters, vol. 17, No. 5, May 1996, pp. 193-195.

"In-Depth Analysis of Opposite Channel Based Charge Injection in SOI MOSFETs and Related Defect Creation and Annihilation", Sinha et al., Elsevier Science, Microelectronic Engineering 28, 1995, pp. 383-386.

"Dynamic Effects in SOI MOSFET's", Giffard et al., IEEE, 1991, pp. 160-161.

"A Simple 1-Transistor Capacitor-Less Memory Cell for High Performance Embedded DRAMs", Fazan et al., IEEE 2002 Custom Integrated Circuits Conference, Jun. 2002, pp. 99-102.

"A Novel Pattern Transfer Process for Bonded SOI Giga-bit DRAMs", Lee et al., Proceedings 1996 IEEE International SOI Conference, Oct. 1996, pp. 114-115.

"An Experimental 2-bit/Cell Storage DRAM for Macrocell or Memory-on-Logic Application", Furuyama et al., IEEE Journal of Solid-State Circuits, vol. 24, No. 2, Apr. 1989, pp. 388-393.

"High-Performance Embedded SOI DRAM Architecture for the Low-Power Supply", Yamauchi et al., IEEE Journal of Solid-State Circuits, vol. 35, No. 8, Aug. 2000, pp. 1169-1178.

"An SOI-DRAM with Wide Operating Voltage Range by CMOS/SIMOX Technology", Suma et al., 1994 IEEE International Solid-State Circuits Conference, pp. 138-139.

"A Capacitorless DRAM Cell on SOI Substrate", Wann et al., IEEE IEDM, 1993, pp. 635-638.

"The Multistable Charge Controlled Memory Effect in SOI Transistors at Low Temperatures", Tack et al., IEEE Workshop on Low Temperature Electronics, Aug. 7-8, 1989, University of Vermont, Burlington, pp. 137-141.

"High-Endurance Ultra-Thin Tunnel Oxide in MONOS Device Structure for Dynamic Memory Application", Wann et al., IEEE Electron Device Letters, vol. 16, No. 11, Nov. 1995, pp. 491-493.

"Hot-Carrier Effects in Thin-Film Fully Depleted SOI MOSFET's", Ma et al., IEEE Electron Device Letters, vol. 15, No. 6, Jun. 1994, pp. 218-220.

"Design Analysis of Thin-Body Silicide Source/Drain Devices", 2001 IEEE International SOI Conference, Oct. 2001, pp. 21-22.

"SOI MOSFET on Low Cost SPIMOX Substrate", Iyer et al., IEEE IEDM, Sep. 1998, pp. 1001-1004.

"Simulation of Floating Body Effect in SOI Circuits Using BSIM3SOI", Tu et al., Proceedings of Technical Papers (IEEE Cat No. 97TH8303), pp. 339-342.

"High-Field Transport of Inversion-Layer Electrons and Holes Including Velocity Overshoot", Assaderaghi et al., IEEE Transactions on Electron Devices, vol. 44, No. 4, Apr. 1997, pp. 664-671.

"Dynamic Threshold-Voltage MOSFET (DTMOS) for Ultra-Low Voltage VLSI", Assaderaghi et al., IEEE Transactions on Electron Devices, vol. 44, No. 3, Mar. 1997, pp. 414-422.

"Hot-Carrier-Induced Degradation in Ultra-Thin-Film Fully-Depleted SOI MOSFETs", Yu et al., Solid-State Electronics, vol. 39, No. 12, 1996, pp. 1791-1794.

Hot-Carrier Effect in Ultra-Thin-Film (UTF) Fully-Depleted SOI MOSFET's, Yu et al., 54th Annual Device Research Conference Digest (Cat. No. 96TH8193), pp. 22-23.

"SOI MOSFET Design for All-Dimensional Scaling with Short Channel, Narrow Width and Ultra-thin Films", Chan et al., IEEE IEDM, 1995, pp. 631-634.

"A Novel Silicon-On-Insulator (SOI) MOSFET for Ultra Low Voltage Operation", Assaderaghi et al., 1994 IEEE Symposium on Low Power Electronics, pp. 58-59.

"Interface Characterization of Fully-Depleted SOI MOSFET by a Subthreshold I-V Method", Yu et al., Proceedings 1994 IEEE International SOI Conference, Oct. 1994, pp. 63-64.

"A Capacitorless Double-Gate DRAM Cell Design for High Density Applications", Kuo et al., IEEE IEDM, Feb. 2002, pp. 843-846.

"A Dynamic Threshold Voltage MOSFET (DTMOS) for Ultra-Low Voltage Operation", Assaderaghi et al., IEEE IEDM, 1994, pp. 809-812.

"Dynamic Threshold Voltage MOSFET (DTMOS) for Very Low Voltage Operation", Assaderaghi et al., IEEE Electron Device Letters, vol. 15, No. 12, Dec. 1994, pp. 510-512.

"A Capacitorless DRAM Cell on SOI Substrate", Wann et al., IEEE IEDM 1993, pp. 635-638.

"Studying the Impact of Gate Tunneling on Dynamic Behaviors of Partially-Depleted SOI CMOS Using BSIMPD", Su et al., IEEE Proceedings of the International Symposium on Quality Electronic Design (ISQED '02), Apr. 2002 (5 pages).

"Characterization of Front and Back Si-SiO$_2$ Interfaces in Thick- and Thin-Film Silicon-on-Insulator MOS Structures by the Charge-Pumping Technique", Wouters et al., IEEE Transactions on Electron Devices, vol. 36, No. 9, Sep. 1989, pp. 1746-1750.

"An Analytical Model for the Misis Structure in SOI MOS Devices", Tack et al., Solid-State Electronics vol. 33, No. 3, 1990, pp. 357-364.

"A Long Data Retention SOI DRAM with the Body Refresh Function", Tomishima et al., IEICE Trans. Electron., vol. E80-C, No. 7, Jul. 1997, pp. 899-904.

"Capacitor-Less 1-Transistor DRAM", Fazan et al., 2002 IEEE International SOI Conference, Oct. 2002, pp. 10-13.

"SOI (Silicon-on-Insulator) for High Speed Ultra Large Scale Integration", C. Hu, Jpn. J. Appl. Phys. vol. 33 (1994) pp. 365-369, Part 1, No. 1B, Jan. 1994.

"Source-Bias Dependent Charge Accumulation in P+-Poly Gate SOI Dynamic Random Access Memory Cell Transistors", Sim et al., Jpn. J. Appl. Phys. vol. 37 (1998) pp. 1260-1263, Part 1, No. 3B, Mar. 1998.

"Suppression of Parasitic Bipolar Action in Ultra-Thin-Film Fully-Depleted CMOS/SIMOX Devices by Ar-Ion Implantation into Source/Drain Regions", Ohno et al., IEEE Transactions on Electron Devices, vol. 45, No. 5, May 1998, pp. 1071-1076.

dRAM Design Using the Taper-Isolated Dynamic RAM Cell, Leiss et al., IEEE Transactions on Electron Devices, vol. ED-29, No. 4, Apr. 1982, pp. 707-714.

"Fully Isolated Lateral Bipolar-MOS Transistors Fabricated in Zone-Melting-Recrystallized Si Films on SiO2", Tsaur et al., IEEE Electron Device Letters, vol. EDL-4, No. 8, Aug. 1983, pp. 269-271.

"Silicon-On-Insulator Bipolar Transistors", Rodder et al., IEEE Electron Device Letters, vol. EDL-4, No. 6, Jun. 1983, pp. 193-195.

"Characteristics and Three-Dimensional Integration of MOSFET's in Small-Grain LPCVD Polycrystalline Silicon", Malhi et al., IEEE Transactions on Electron Devices, vol. ED-32, No. 2, Feb. 1985, pp. 258-281.

"Triple-Wel nMOSFET Evaluated as a Capacitor-Less DRAM Cell for Nanoscale Low-Cost & High Density Applications", Villaret et al., Handout at Proceedings of 2003 Silicon Nanoelectronics Workshop, Jun. 8-9, 2003, Kyoto, Japan (2 pages).

"Mechanisms of Charge Modulation in the Floating Body of Triple-Well NMOSFET Capacitor-less DRAMs", Villaret et al., Handout at Proceedings of INFOS 2003, Jun. 18-20, 2003, Barcelona, Spain (2 pages).

"Embedded DRAM Process Technology", M. Yamawaki, Proceedings of the Symposium on Semiconductors and Integrated Circuits Technology, 1998, vol. 55, pp. 38-43.

"3-Dimensional Simulation of Turn-off Current in Partially Depleted SOI MOSFETs", Ikeda et al., IEIC Technical Report, Institute of Electronics, Information and Communication Engineers, 1998, vol. 97, No. 557 (SDM97 186-198), pp. 27-34.

"Dynamic floating body control SOI CMOS for power managed multimedia ULSIs", F. Morishita et al., Proc. CICC, pp. 263-266, 1997.

"A 312-MHz 16-Mb Random-Cycle Embedded DRAM Macro With a Power-Down Data Retention Mode for Mobile Applications", F. Morishita et al., J. Solid-State Circuits, vol. 40, No. 1, pp. 204-212, 2005.

"Leakage Mechanism due to Floating Body and Countermeasure on Dynamic Retention Mode of SOI-DRAM", F. Morishita et al., Symposium on VLSI Technology Digest of Technical Papers, pp. 141-142, 1995.

* cited by examiner

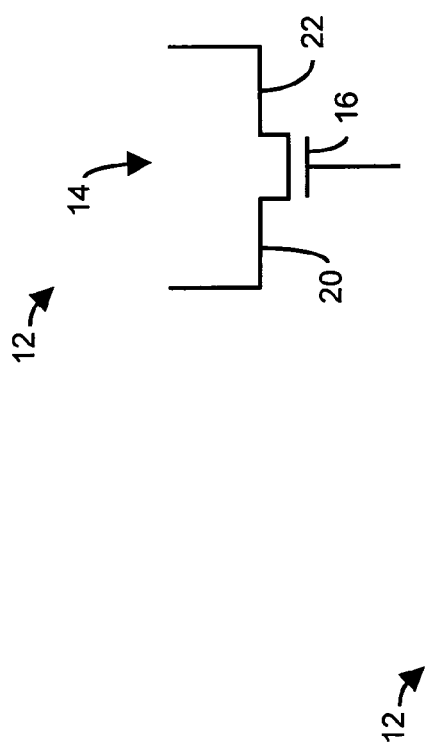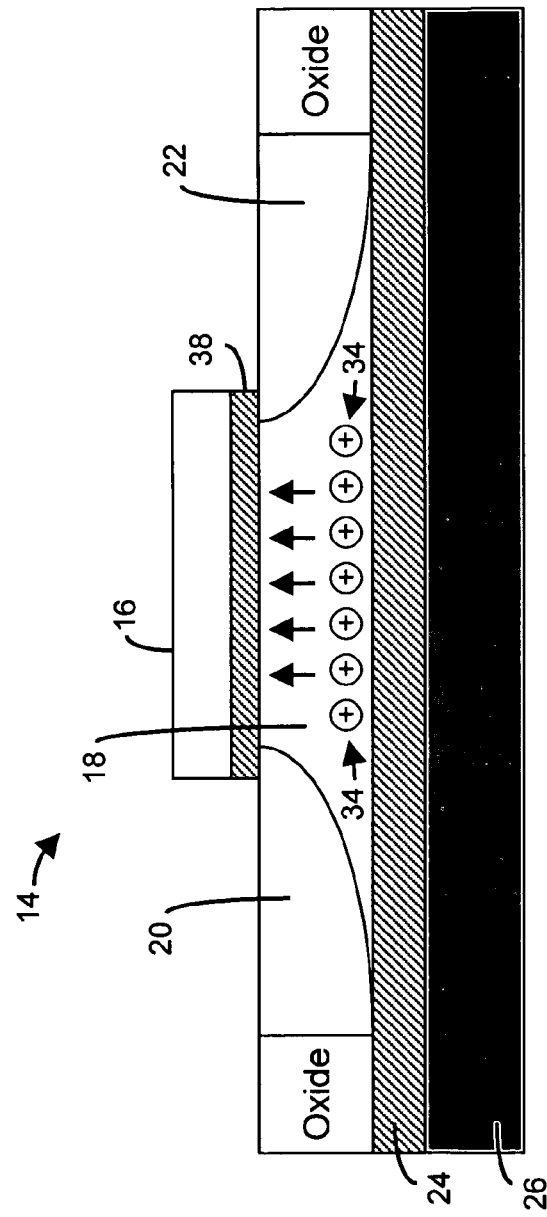
FIGURE 4A
FIGURE 4B

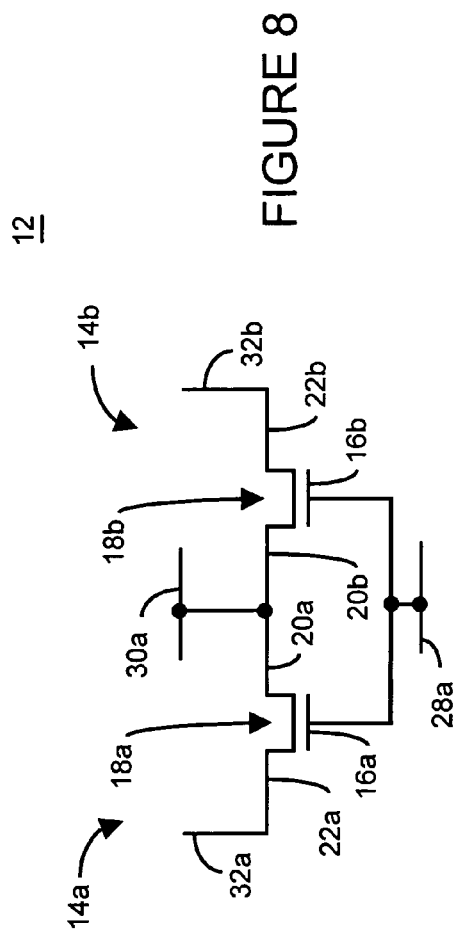
FIGURE 8
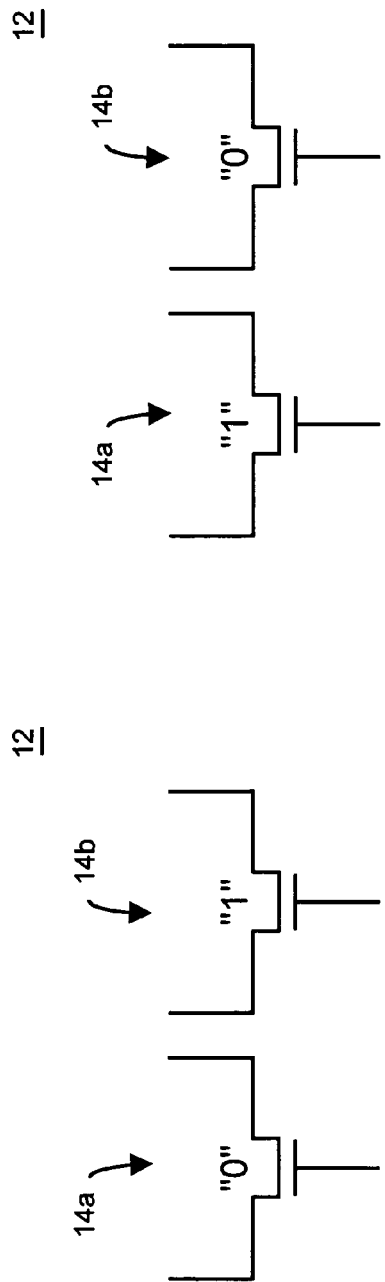
FIGURE 9B
FIGURE 9A

MEMORY CELL HAVING AN ELECTRICALLY FLOATING BODY TRANSISTOR AND PROGRAMMING TECHNIQUE THEREFOR

RELATED APPLICATIONS

This application claims priority to U.S. Provisional Application Ser. No. 60/625,248, entitled "Programming Technique for a Memory Cell Having an Electrically Floating Body Transistor", filed Nov. 4, 2004. The contents of this provisional application are incorporated by reference herein in their entirety.

BACKGROUND

In one aspect, the inventions relate to a semiconductor memory cell, array, architecture and device, and techniques for controlling and/or operating such cell and device; and more particularly, in one aspect, to a semiconductor dynamic random access memory ("DRAM") cell, array, architecture and/or device wherein the memory cell includes an electrically floating body in which an electrical charge is stored.

Briefly, by way of background, there is a continuing trend to employ and/or fabricate advanced integrated circuits using techniques, materials and devices that improve performance, reduce leakage current and enhance overall scaling. Silicon-on-Insulator (SOI) is a material in which such devices may be fabricated on or in (hereinafter collectively "on"). Such devices are known as SOI devices and include, for example, partially depleted (PD), fully depleted (FD) devices, multiple gate devices (for example, double or triple gate), and FinFET. SOI devices have demonstrated improved performance (for example, speed), reduced leakage current characteristics and considerable enhancement in scaling.

One type of dynamic random access memory cell is based on, among other things, a floating body effect of SOI transistors. (See, for example, U.S. patent application Ser. No. 10/450,238, Fazan et al., filed Jun. 10, 2003 and entitled "Semiconductor Device", hereinafter "Semiconductor Memory Device Patent Application"). In this regard, the memory cell may consist of a PD or a FD SOI transistor (or transistor formed in bulk material/substrate) on having a channel, which is disposed adjacent to the body and separated therefrom by a gate dielectric. The body region of the transistor is electrically floating in view of the insulation or non-conductive region (for example, in bulk-type material/substrate) disposed beneath the body region. The state of memory cell is determined by the concentration of charge within the body region of the SOI transistor.

With reference to FIGS. 1A, 1B and 1C, in one embodiment, semiconductor DRAM array 10 includes a plurality of memory cells 12 each consisting of transistor 14 having gate 16, body region 18, which is electrically floating, source region 20 and drain region 22. The body region 18 is disposed between source region 20 and drain region 22. Moreover, body region 18 is disposed on or above region 24, which may be an insulation region (for example, in SOI material/substrate) or non-conductive region (for example, in bulk-type material/substrate). The insulation or non-conductive region may be disposed on substrate 26.

Data is written into or read from a selected memory cell by applying suitable control signals to a selected word line(s) 28, a selected source line(s) 30 and/or a selected bit line(s) 32. In response, charge is accumulated in or emitted and/or ejected from electrically floating body region 18 wherein the data states are defined by the amount of charge or carriers (for example, majority carriers) within electrically floating body region 18. Notably, the entire contents of the Semiconductor Memory Device Patent Application, including, for example, the features, attributes, architectures, configurations, materials, techniques and advantages described and illustrated therein, are incorporated by reference herein.

As mentioned above, memory cell 12 of DRAM array 10 operates by accumulating in or emitting/ejecting majority carriers (electrons or holes) 34 from body region 18 of, for example, an N-channel transistor. (See, FIGS. 2A and 2B). In this regard, accumulating majority carriers (in this example, "holes") 34 in body region 18 of memory cells 12 via, for example, impact ionization near source region 20 and/or drain region 22, provides or results in a carrier concentration which is representative of a logic high or "1" data state. (See, FIG. 2A). Emitting or ejecting majority carriers 30 from body region 18 via, for example, forward biasing the source/body junction and/or the drain/body junction, provides or results in a carrier concentration which is representative of a logic low or "0" data state. (See, FIG. 2B).

Notably, for at least the purposes of this discussion, logic high or State "1" corresponds to an increased concentration of majority carries in the body region relative to an unprogrammed device and/or a device that is programmed with a logic low or State "0". In contrast, logic low or State "0" corresponds to a reduced concentration of majority carries in the body region relative to an unprogrammed device and/or a device that is programmed with a logic high or State "1".

As mentioned above, conventional techniques write or program a logic low (State "0") by removing majority carriers from body region 18 through either source region 20 or drain region 22 of electrically floating body transistor 14 of memory cell 12. In this regard, in one embodiment, majority carriers (in this example, "holes") 34 in body region 18 of memory cells 12 are removed from memory cell 12 through drain region 22. (See, FIG. 3A). A current 36 (electrons) flows from drain region 22 to source region 20 due to a channel forming in a portion of body region 18 immediately beneath the gate oxide when writing or programming a logic low (State "0"). Where the majority carriers (in this example, "holes") 34 are removed from memory cell 12 through source region 20, current 36 (electrons) flows from source region 20 to drain region 22 as a result of channel formation when writing or programming a logic low (State "0"). (See, FIG. 3B).

Aside from the consumption of power, writing or programming data into memory cells of an array may also "disturb" adjacent cell memory cells in memory device 10. One technique to address the disturbance issue is to employ a two-cycle write or program technique. In this regard, in one embodiment, in the first cycle a logic low (State "0") is written into all memory cells 12 connected to a word line 28; in the second cycle, a logic high (State "1") is selectively written into memory cells 12 while an inhibit signal or voltage is applied to those memory cells 12 that are to remain at or maintain a logic low or State "0". In this way, certain memory cells 12 connected to a given word line may be written or programmed to a logic low (State "0") using a first word line voltage; and certain other memory cells 12, also connected to the given word line, may be written or programmed to a logic high (State "1") using a second word line voltage. (See, for example, application Ser. No. 10/840,009, which was filed by Ferrant et al. on May 6, 2004, and entitled "Semiconductor Memory Device and Method of Operating Same").

While electrically floating body transistors of memory cells (for example, SOI transistors) of the type described above exhibit low leakage current characteristics, such memory cells often consume a considerable amount of power when programming a logic low (i.e., removing charge carriers from the body of the SOI device). Moreover, many architectures and programming techniques tend to provide a two-cycle writing or programming techniques. This may reduce the speed or access time of the memory device, memory array, and/or memory cells. As such, there is a need for high performance floating body memory cells, devices and arrays having improved performance characteristics (for example, speed and/or programming window, programming current consumption), reduced leakage current characteristics and/or considerably enhanced scaling and density capabilities.

SUMMARY OF THE INVENTIONS

There are many inventions described and illustrated herein. The present inventions are neither limited to any single aspect nor embodiment thereof, nor to any combinations and/or permutations of such aspects and/or embodiments. Moreover, each of the aspects of the present inventions, and/or embodiments thereof, may be employed alone or in combination with one or more of the other aspects of the present inventions and/or embodiments thereof. For the sake of brevity, many of those permutations and combinations will not be discussed separately herein.

In one aspect, the present inventions are directed to a semiconductor memory cell, array, architecture and device, and techniques for controlling and/or operating such cell and device; and more particularly, in one aspect, to a semiconductor dynamic random access memory ("DRAM") cell, array, architecture and/or device wherein the memory cell includes an electrically floating body in which an electrical charge is stored.

In another aspect, the present inventions are directed to a semiconductor memory cell comprising an electrically floating body transistor including a source region, a drain region, a body region disposed between the source region and the drain region, wherein the body region is electrically floating; and a gate disposed over the body region and separated therefrom by a gate dielectric. The memory cell includes a first data state which is representative of a first charge in the body region, and a second data state which is representative of a second charge in the body region wherein the second charge is substantially provided by removing charge from the body region through the gate.

The first charge may be comprised of an accumulation of majority carriers in the body region (for example, via impact ionization or band-to-band tunneling phenomenon). In one embodiment, the second charge is provided in the body region by applying (i) positive voltages to the drain region and source region, and (ii) a negative voltage to the gate. Indeed, in one embodiment, positive voltages are applied to the drain region and source region to substantially remove at least the first charge from the body region through the gate.

In another embodiment, in response to control signals applied to the gate, drain region and source region, the second charge is substantially provided in the body region by causing, forcing and/or inducing majority carriers in the floating body to tunnel through the gate dielectric to the gate.

In yet another embodiment, negative voltages are applied to the drain region and source region and a positive voltage is applied to the gate to provide the second charge in the body region. Here, the electrically floating body transistor may be a P-channel type transistor.

In another aspect, the present inventions are directed to a semiconductor memory cell array comprising a plurality of memory cells arranged in a matrix of rows and column. Each memory cell of the array includes a transistor to constitute the memory cell. Each transistor comprises a source region, a drain region, a body region disposed between the source region and the drain region, wherein the body region is electrically floating, and a gate disposed over the body region and separated therefrom by a gate dielectric. Each memory cell of the array includes a first data state representative of a first charge in the body region of the associated transistor and a second data state representative of a second charge in the body region of the associated transistor wherein the second charge is substantially provided by removing charge from the body region through the gate of the associated transistor.

In one embodiment, the source region of the transistor of each memory cell corresponding to a first row of semiconductor dynamic random access memory cells is connected to a first source line, and the gate of the transistor of each memory cell corresponding to the first row of semiconductor dynamic random access memory cells is connected to a first word line. In this embodiment, the source region of the transistor of each memory cell corresponding to a second row of semiconductor dynamic random access memory cells may be connected to the first source line, and the gate of the transistor of each memory cell corresponding to the second row of semiconductor dynamic random access memory cells may be connected to a second word line. Further, the source region of the transistor of each memory cell corresponding to a third row of semiconductor dynamic random access memory cells may be connected to a second source line, and wherein the gate of the transistor of each memory cell corresponding to the third row of semiconductor dynamic random access memory cells may be connected to a third word line.

In one embodiment, the drain region of the transistor of each memory cell corresponding to the first row of semiconductor dynamic random access memory cells is the same region as the drain region of an adjacent memory cell of the third row.

The first charge may be comprised of an accumulation of majority carriers in the body region. A memory cell of the array may be programmed in the first data state via impact ionization or band-to-band tunneling phenomenon.

In one embodiment, a memory cell of the array may be programmed to the second data state by applying (i) a positive voltage to the drain region of the associated transistor, (ii) a positive voltage to the source region of the associated transistor, and (iii) a negative voltage to the gate of the associated transistor. In response to (i) the positive voltage to the drain region of the associated transistor, (ii) the positive voltage to the source region of the associated transistor, and (iii) the negative voltage to the gate of the associated transistor, the second charge is substantially provided in the body region of the associated transistor by causing, forcing and/or inducing majority carriers in the floating body of the associated transistor to tunnel through the gate dielectric to the gate of the associated transistor.

In another embodiment, the memory cell of the array may be programmed to the second data state by applying (i) a negative voltage to the drain region of the associated transistor, (ii) a negative voltage to the source region of the associated transistor, and (iii) a positive voltage to the gate of the associated transistor.

In another aspect, the present inventions are directed to a method of programming a semiconductor memory cell comprising an electrically floating body transistor including a source region, a drain region, a body region disposed between the source region and the drain region, wherein the body region is electrically floating, and a gate disposed over the body region and separated therefrom by a gate dielectric. The memory cell includes a first data state representative of a first charge in the body region and a second data state representative of a second charge in the body region wherein the second charge is substantially provided by removing charge from the body region through the gate. The method comprises applying a first voltage to the drain region applying a second voltage to the source region, applying a third voltage to the gate region wherein in response to the first, second and third voltages, the second charge is provided in the body region by causing, forcing and/or inducing majority carriers in the floating body to tunnel through the gate dielectric to the gate.

In one embodiment, the first and second voltages are positive, and the third voltage is negative. In another embodiment, the first and second voltages are negative, and the third voltage is positive.

The method may further include providing the first data state in the memory cell via impact ionization or band-to-band tunneling phenomenon.

Again, there are many inventions, and aspects of the inventions, described and illustrated herein. This Summary of the Invention is not exhaustive of the scope of the present inventions. Moreover, this Summary of the Invention is not intended to be limiting of the inventions and should not be interpreted in that manner. While certain embodiments have been described and/or outlined in this Summary of the Inventions, it should be understood that the present inventions are not limited to such embodiments, description and/or outline, nor are the claims limited in such a manner. Indeed, many others embodiments, which may be different from and/or similar to, the embodiments presented in this Summary, will be apparent from the description, illustrations and claims, which follow. In addition, although various features, attributes and advantages have been described in this Summary of the Invention and/or are apparent in light thereof, it should be understood that such features, attributes and advantages are not required whether in one, some or all of the embodiments of the present inventions and, indeed, need not be present in any of the embodiments of the present inventions.

BRIEF DESCRIPTION OF THE DRAWINGS

In the course of the detailed description to follow, reference will be made to the attached drawings. These drawings show different aspects of the present inventions and, where appropriate, reference numerals illustrating like structures, components, materials and/or elements in different figures are labeled similarly. It is understood that various combinations of the structures, components, materials and/or elements, other than those specifically shown, are contemplated and are within the scope of the present inventions.

FIG. 4A is a schematic representation of a memory cell comprised of an electrically floating body transistor;

FIGS. 4B and 4C are exemplary schematic illustrations of the charge relationship, for programming or writing a logic low or State "0" into an electrically floating body transistor, according to one embodiment of the present invention;

FIG. 8 illustrates a memory cell including two electrically floating body transistors that are configured to have a common source region and connected gates, that may be controlled, programmed and/or operated according to one embodiment of the techniques of the present invention; and FIGS. 9A and 9B illustrate the two data states of the memory cell having two electrically floating body transistors of, for example, FIG. 8.

DETAILED DESCRIPTION

Figure 1A:
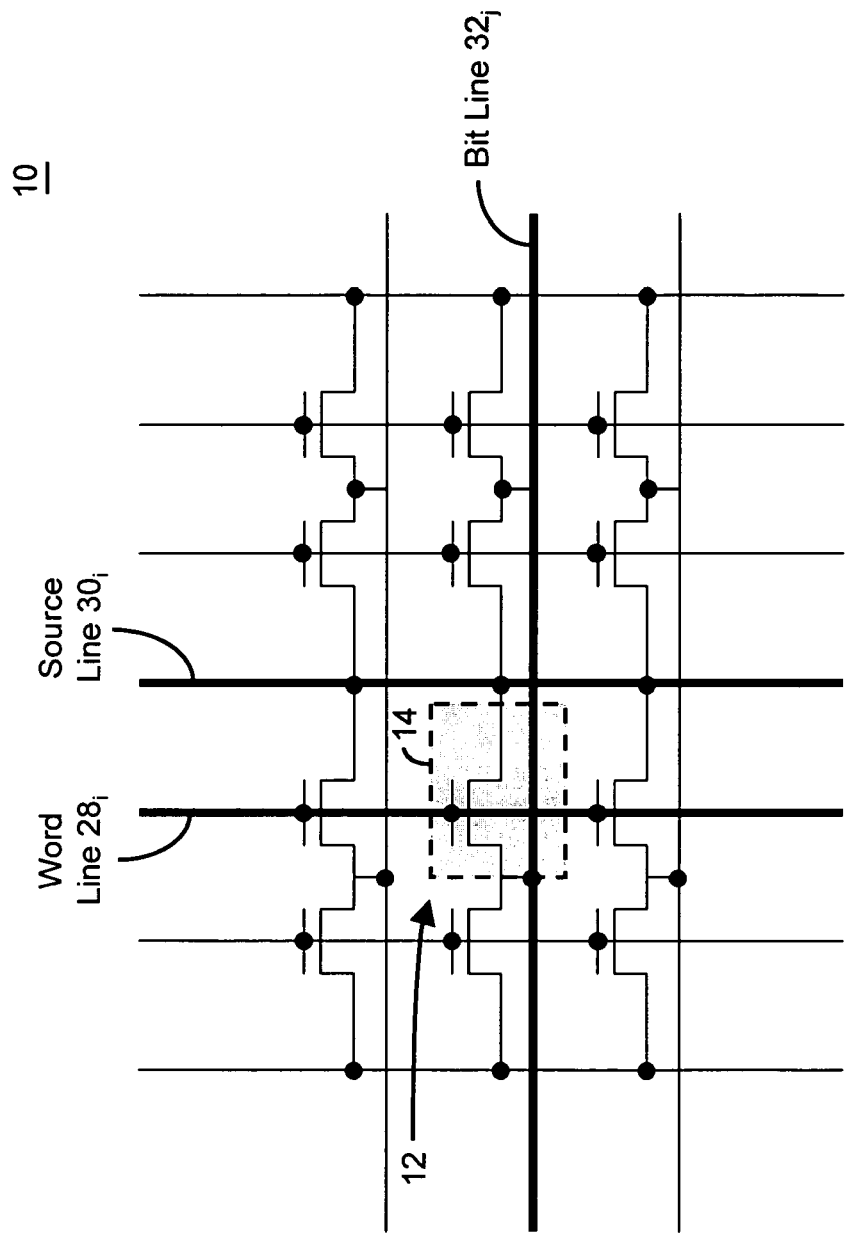
FIG. 1A is a schematic representation of a prior art semiconductor DRAM array including a plurality of memory cells comprised of one electrically floating body transistor.
Figure 1B:
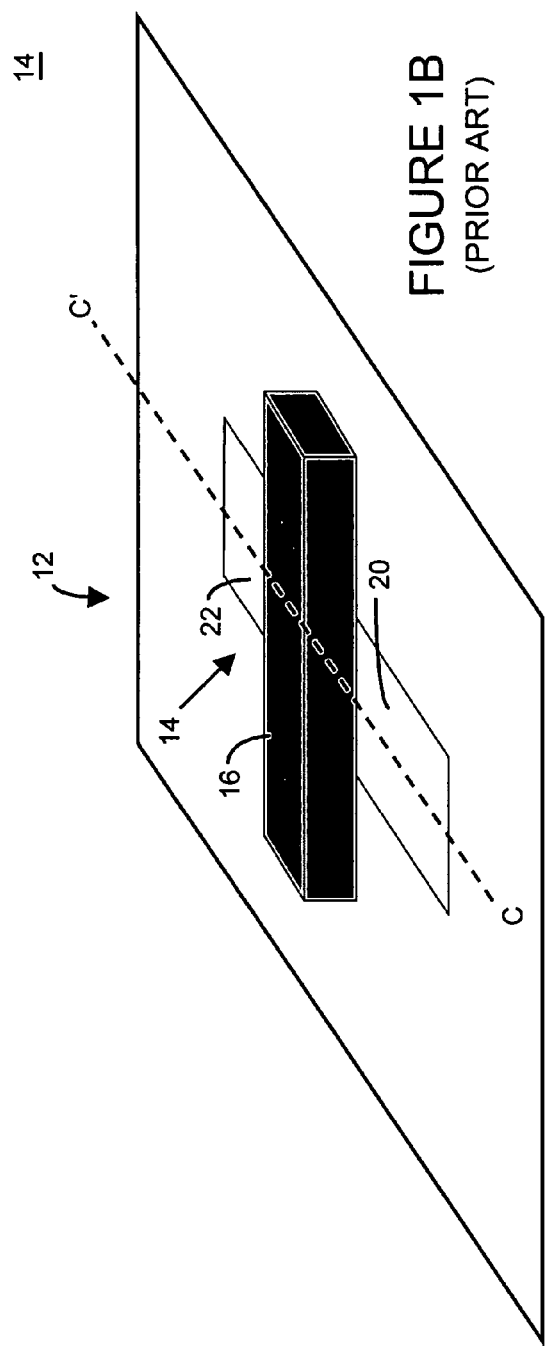
FIG. 1B is a three dimensional view of an exemplary prior art memory cell comprised of one electrically floating body transistor (PD-SOI NMOS)
Figure 1C:
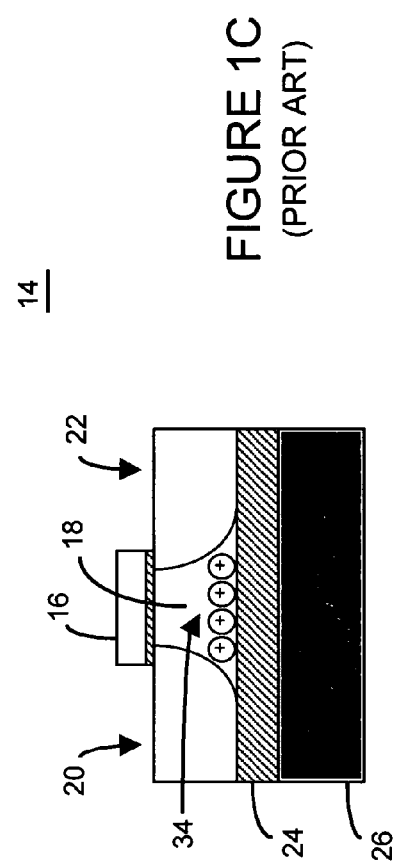
FIG. 1C is a cross-sectional view of the prior art memory cell of FIG. 1B, cross-sectioned along line C-C'.
Figure 2A:
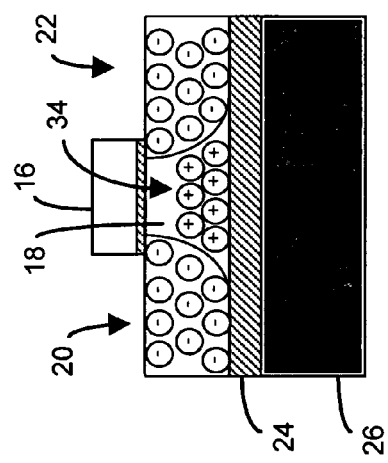
FIGS. 2A and 2B are exemplary schematic illustrations of the charge relationship, for a given data state, of the floating body, source and drain regions of a prior art memory cell comprised of one electrically floating body transistor (PD-SOI NMOS)
Figure 2B:
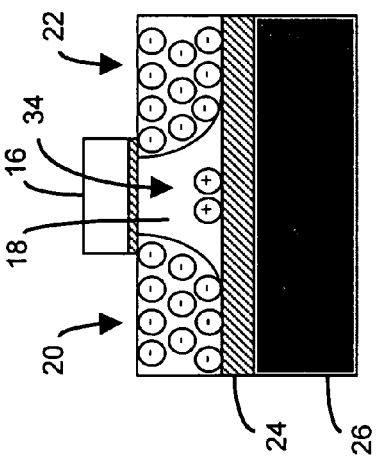
Figure 3A:
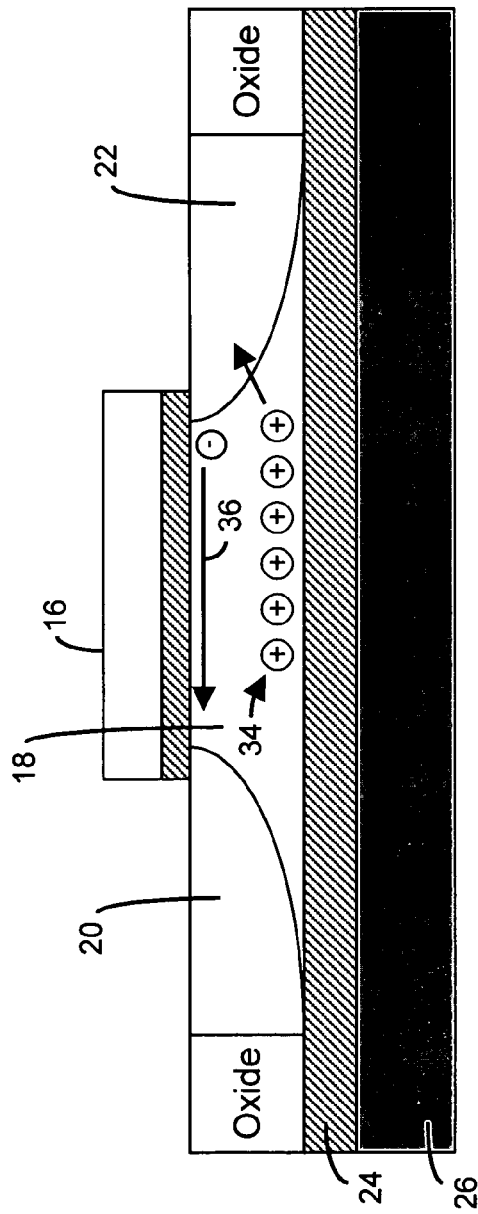
FIGS. 3A and 3B are exemplary schematic illustrations of the charge relationship pertaining to conventional techniques for programming or writing a logic low or State "0" into an electrically floating body transistor (for example, a PD-SOI NMOS)
Figure 3B:
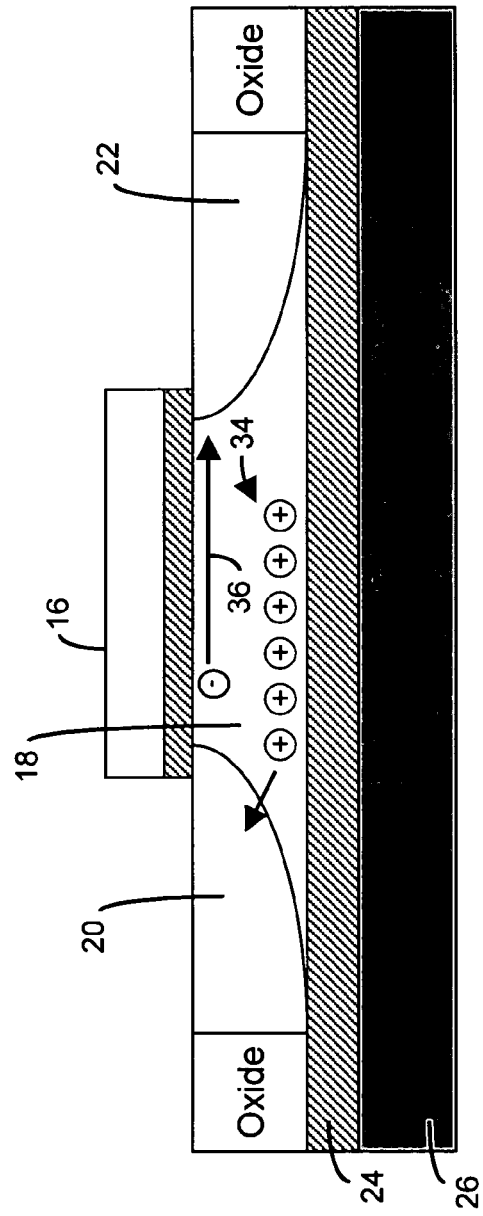

At the outset, it should be noted that there are many inventions described herein as well as many aspects and embodiments of those inventions.

In a first aspect, the present inventions are directed to a memory cell and/or technique of writing or programming a logic low or State "0" in a memory cell having an electrically floating body transistor. In this regard, in one embodiment, the present inventions program a logic low or State "0" in the memory cell by causing, forcing and/or inducing majority carriers in the floating body to tunnel through or traverse the gate dielectric to the gate of the electrically floating body transistor (and, in many array configurations, the word line in the context of a memory cell array). As such, a carrier concentration, which is representative of a logic low or "0" data state, is provided (or substantially provided) in the electrically floating body by removing majority carriers from the electrically floating body to the gate of the electrically floating body transistor.

Notably, the memory cell may be programmed to a logic low or State "0" while the electrically floating body transistor is in the "OFF" state or substantially "OFF" state (for example, when the device has no (or practically no) channel and/or channel current between the source and drain). In this way, the memory cell may be programmed whereby there is little to no current/power consumption by the electrically floating body transistor and/or from memory array having a plurality of electrically floating body transistors.

With reference to FIGS. 4A and 4B, in one embodiment, the present inventions include memory cell 12 having electrically floating body transistor 14. In this exemplary embodiment, electrically floating body transistor 14 is a N-channel type transistor. As such, majority carriers 34 are "holes".

In operation, electrically floating body transistor 14 is programmed in a logic low or State "0" by causing, forcing and/or inducing majority carriers in floating body 18 of electrically floating body transistor 14 to tunnel through or traverse gate dielectric 38 to gate 16 of transistor 14. In one embodiment, the "holes" (majority carriers 34) may be forced and/or induced to tunnel to gate 16 by applying a sufficiently large negative voltage to gate 16 relative to source 20 and drain 22. For example, in one embodiment, 0 volts may be applied to source region 20 and drain region 22 and a negative voltage (for example, −2 volts) may be applied to gate 16 to cause, force and/or induce the holes to tunnel through gate dielectric 38 to gate 16.

Figure 4C:
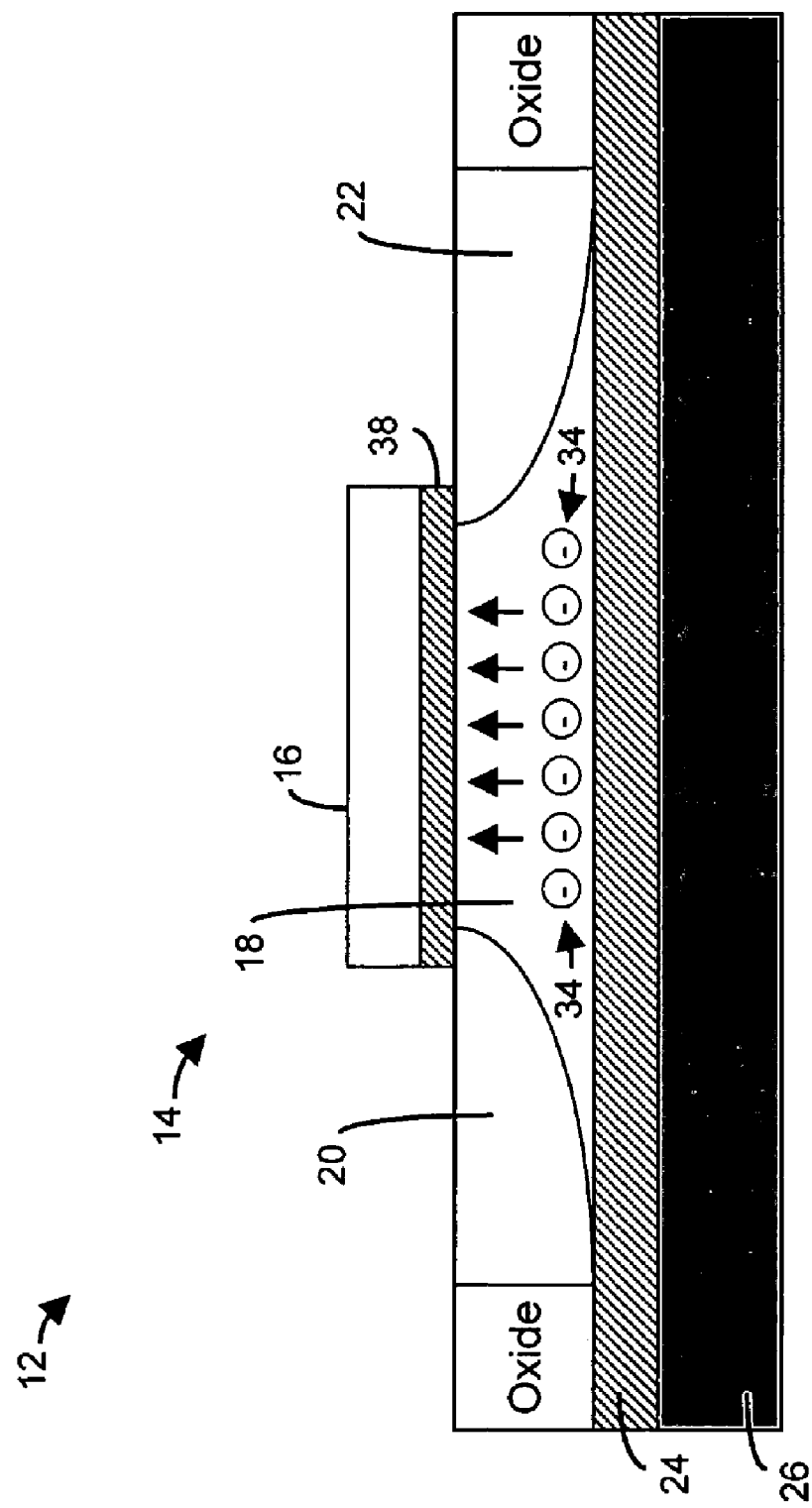

With reference to FIGS. 4A and 4C, in another exemplary embodiment, electrically floating body transistor 14 is a P-channel type transistor. As such, majority carriers 34 are "electrons". In this embodiment, electrically floating body transistor 14 is programmed in a logic low or State "0" by causing, forcing and/or inducing majority carriers 34 in floating body 18 to tunnel through or traverse gate dielectric 38 to gate 16 of transistor 14. In one embodiment, the electron majority carriers may be forced and/or induced to tunnel to gate 16 by applying a sufficiently large positive voltage to gate 16 relative to source 20 and drain 22. For example, in one embodiment, 0 volts may be applied to source region 20 and drain region 22 and a positive voltage (for example, +2 volts) may be applied to gate 16 to cause, force and/or induce the holes to tunnel through gate dielectric 38 to gate 16.

Notably, the present inventions may be implemented using any technique or operation to write or store a logic high or State "1" in the electrically floating body transistor of the memory cell. For example, impact ionization or band-to-band tunneling phenomenon (discussed in detail below) may be employed when writing or storing State "1". Indeed, any technique, whether now known or later developed, may be employed to write or store a logic high or State "1" in the electrically floating body transistor of the memory cell.

Figure 5A:
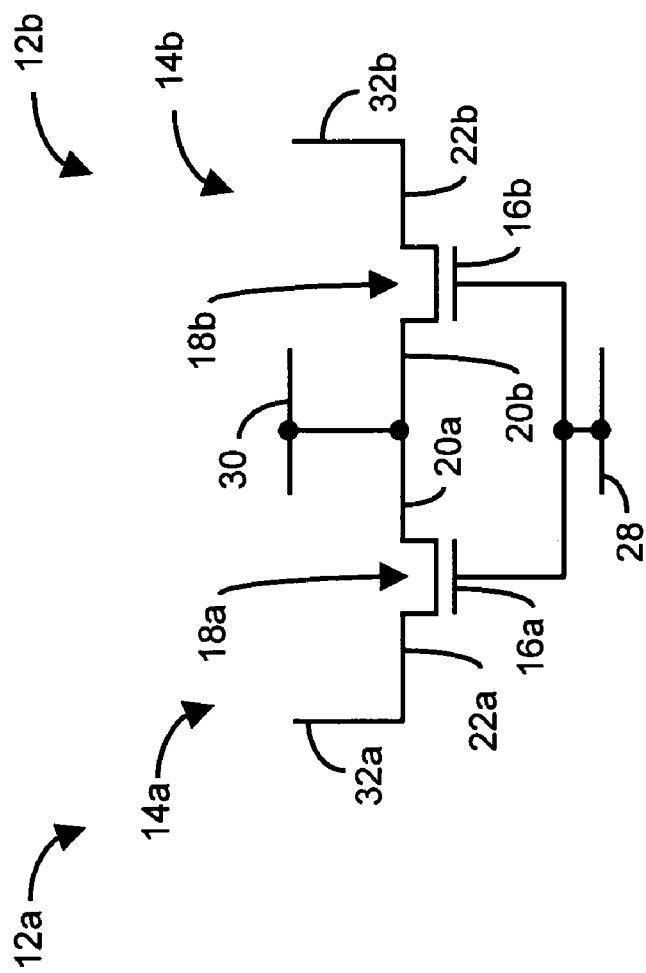
FIGS. 5A and 5C are schematic illustrations of exemplary memory array architectures and memory arrays including, first and second memory cells (each having an electrically floating body transistor), wherein one of the memory cells is programmed to a logic low or State "0" in accordance with the technique of the present invention.

In another aspect, the present invention is a memory array, having a plurality of memory cells each including an electrically floating body transistor, and/or technique of writing or programming data into one or more memory cells of such a memory array. In this aspect of the inventions, the data states of adjacent memory cells and/or memory cells that share a word line may be individually programmed via a one step write. With reference to FIG. 5A, memory array 10 may include first memory cell 12a, having electrically floating body transistor 14a, and second memory cell 12b, having electrically floating body transistor 14b. The word line 28 is connected to gates 16a and 16b of electrically floating body transistors 14a and 14b, respectively, to program the data state of memory cells 12a and 12b.

In this embodiment, memory cells 12a and 12b may be individually programmed via a one step write technique. In operation, memory cell 12a may be programmed to logic low or State "0", as mentioned above, by causing, forcing and/or inducing majority carriers 34 in floating body 18a to tunnel through gate dielectric to gate 16a of transistor 14a. The memory cell 12b may be programmed to a logic high or State "1" using, for example, a technique that employs band-to-band tunneling phenomenon (hereinafter "gate induced drain leakage" (i.e., "GIDL") or "gate induced source leakage" (i.e., GISL), as the case may be).

Figure 6A:
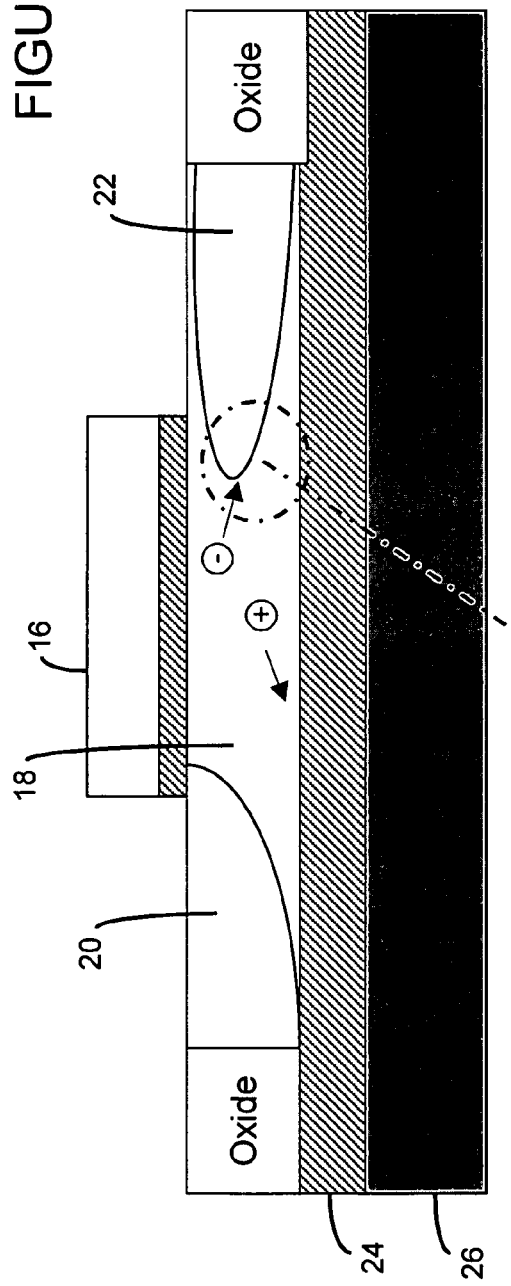
FIGS. 6A and 6B illustrate the GIDL mechanism for writing a logic high or State "1" into an electrically floating body transistor (for example, a PD-SOI NMOS)
Figure 6B:
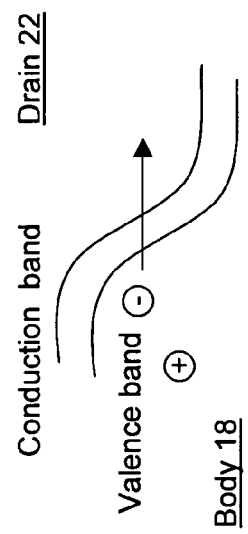

Briefly, by way of background, where memory cell 12 includes an N-channel type transistor (transistor 14), a logic high or State "1" may be stored in transistor 14 by creating excess majority carriers in electrically floating body 18 of transistor 14. The majority carriers 34 ("holes" in this embodiment where transistor 14 is an N-channel type transistor) may be created by a tunneling mechanism that appears in the silicon at the edge of drain region 22. That is, where a negative voltage is applied on gate 16 and a positive voltage is applied at drain region 22, this voltage difference may create a silicon band bending that then leads to a valence band electron tunneling into the conduction band. (See, FIGS. 6A and 6B). The GIDL effect or mechanism may be a very efficient manner of writing or storing a logic high (State "1") because it tends not to cause a channel to form in electrically floating body 18 of transistor 14 and, as such, little to no channel current flows between source region 20 and drain region 18. Notably, the GIDL technique of writing or storing a logic high (State "1") may reduce the current consumption relative to the impact ionization technique.

Thus, with reference to FIG. 5A, in operation, electrically floating body transistor 14a may be programmed to a logic low or State "0" by applying 0 volts to source region 20a and drain region 22a and a negative voltage (for example, −2 volts) to gate 16. In this way, majority carriers tunnel through gate dielectric to gate 16a of transistor 14a. In addition, memory cell 12b may be programmed to a logic high or State "1" by applying a sufficient positive voltage (for example, 1.8 volts) to drain region 22b (i.e., a GIDL programming technique). In this configuration, transistors 14a and 14b "share" or include a common source region and, as such, 0 volts is also applied to source region 20b. Moreover, gates 16a and 16b of transistors 14a and 14b, respectively, are connected to the same word line 28 and, as such, a negative voltage (for example, −2 volts) is also applied to gate 16b. In this way, majority carriers are stored in electrically floating body 18a of transistor 14b, and a logic high or State "1" is stored in memory cell 12b. (See also, memory cells $12a_1$ and $12a_2$ of FIG. 5B).

Figure 5B:
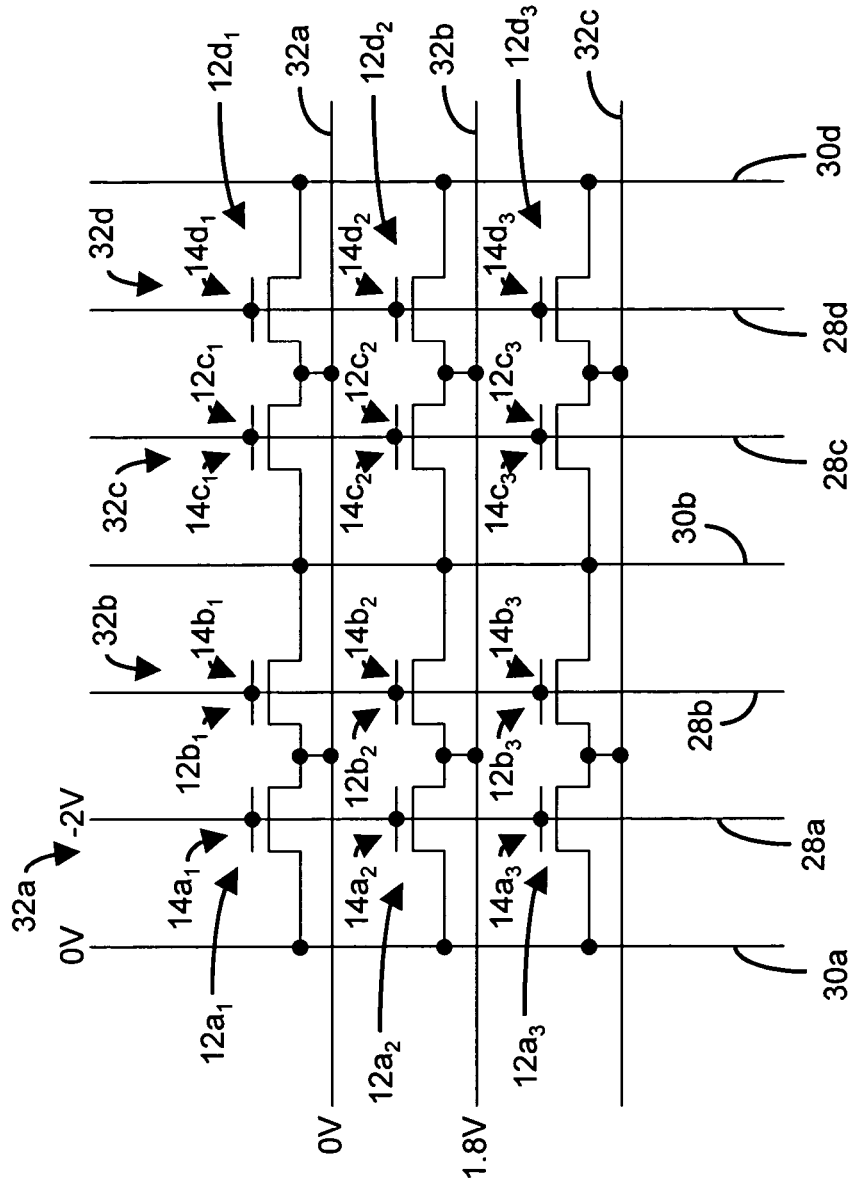
FIG. 5B is a schematic illustration of an exemplary memory array architecture and memory array (like the architecture and array of FIG. 5A) including more than two memory cells and exemplary voltages for programming a logic low or State "0" in accordance with the technique of the present invention.
Figure 5C:
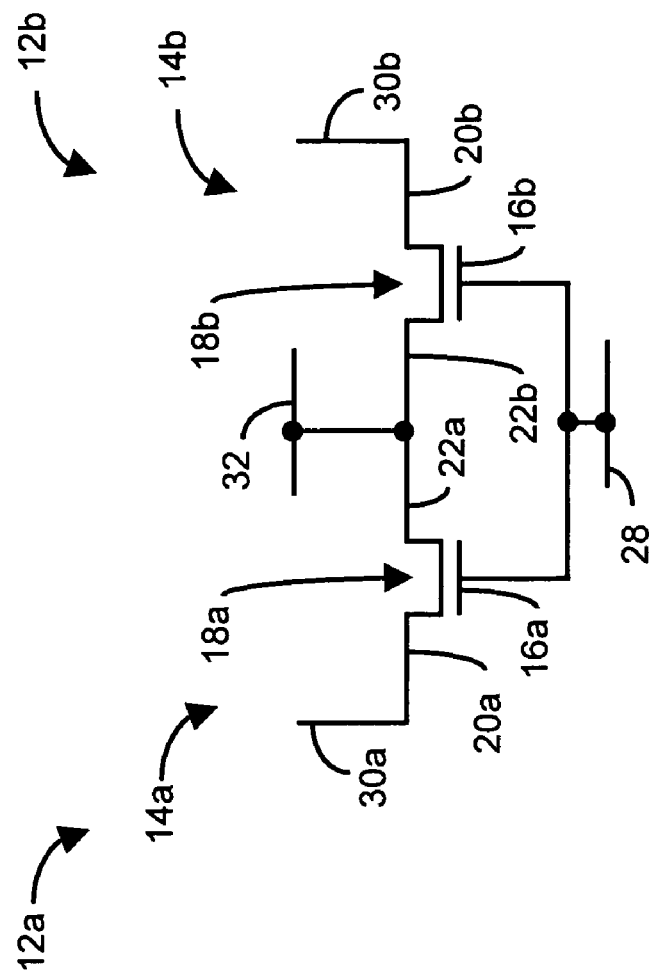
Figure 7:
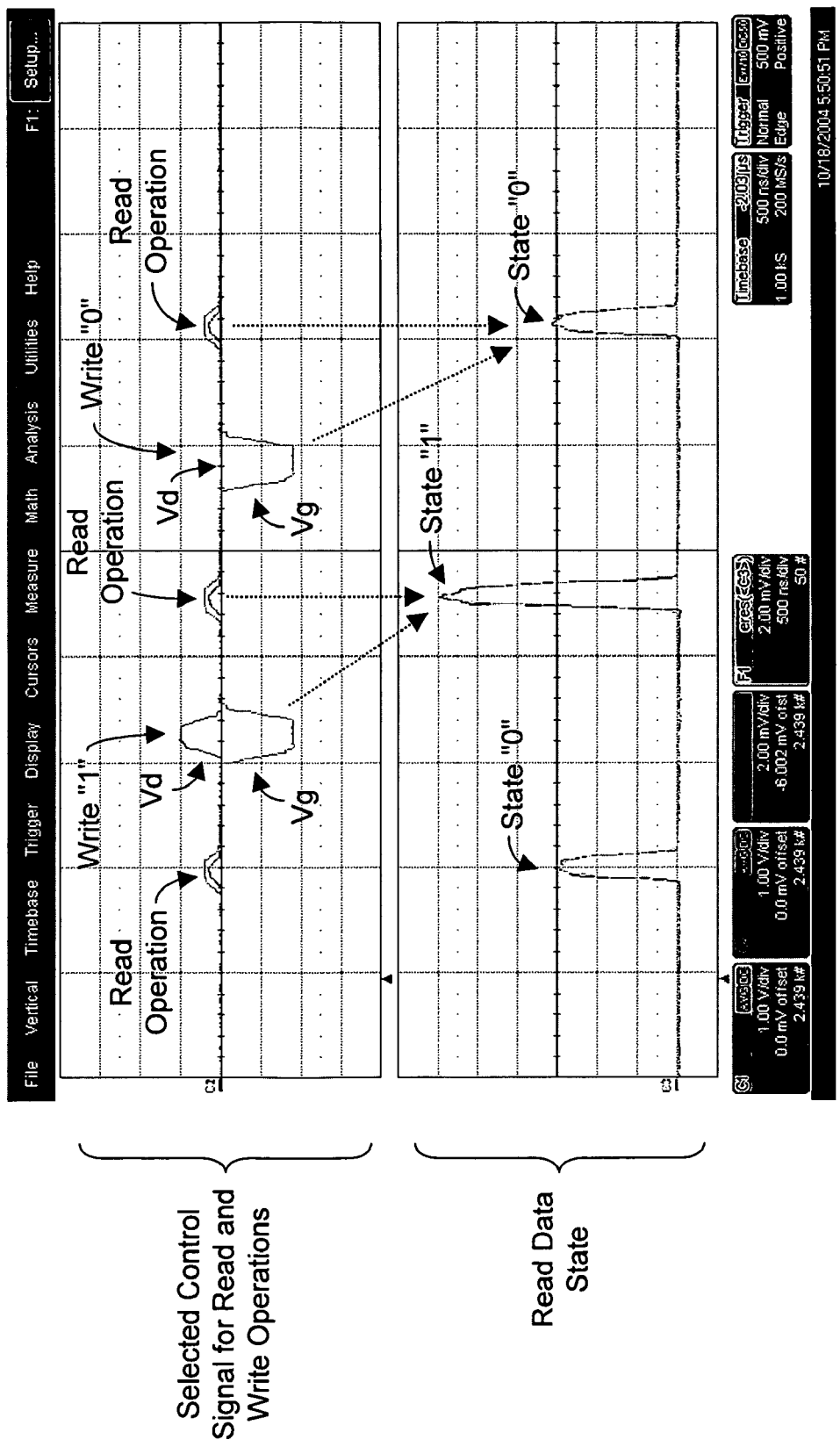
FIG. 7 is an exemplary graphical illustration of selected control signals for writing State "1" and State "0" into a memory cell (having an electrically floating body transistor) wherein the memory cell is programmed to a logic low or State "0" in accordance with the technique of the present inventions and programmed to a logic high or State "1" using a technique that employs band-to-band tunneling phenomenon (described below as a "GIDL" technique)

FIG. 7 is an exemplary graphical illustration of selected control signals for writing State "1" and State "0" into memory cells 12a and 12b of FIG. 5A and memory cells $12a_1$ and $12a_2$ of FIG. 5B.

Notably, those architectures where adjacent memory cells 12a and 12b have a layout whereby gates 16a and 16b of transistors 14a and 14b, respectively, are connected to a common word line and "share" or include a common drain regions 20a and 20b, respectively, a logic high or State "1" may be stored in a memory cell by a tunneling mechanism that appears in the silicon at the edge of the source under specific conditions (referred to above as "gate induced source leakage" or "GISL"). That is, in the context of N-channel type transistors, where a negative voltage is applied on the gate and a positive voltage is applied on the source, this voltage difference may create a silicon band bending at the source-body interface that leads to a valence band electron tunneling into the conduction band. The GISL effect or mechanism may be a very efficient manner of writing or storing a logic high (State "1") because, like GIDL, GISL tends not to cause a channel to form in the body and, as such, little to no channel current flows between the source and the drain.

Notably, while a significant portion of this description include write/programming details directed to N-channel type transistors, the inventions (and embodiments thereof described herein are entirely applicable to P-channel type transistors, as described above (See, for example, FIG. 4C). In such embodiments, majority carriers 34 in body region 18 are electrons and minority carriers are holes, and the voltages applied to the gate may be positive and voltages applied to the source region and drain region may be negative.

Moreover, the memory arrays may be comprised of N-channel, P-channel and/or both types of transistors. Indeed, circuitry that is peripheral to the memory array (for example, sense amplifiers or comparators, row and column address decoders, as well as line drivers (not illustrated herein)) may include P-channel and/or N-channel type transistors. Where P-channel type transistors are employed as memory cells 12 in the memory array(s), suitable write and read voltages (for example, negative voltages) are well known to those skilled in the art in light of this disclosure. Accordingly, for sake of brevity, these discussions will not be repeated.

For example, the electrically floating body transistor, which is programmed to a logic low or State "0" according to the techniques of the present inventions, may be employed in any electrically floating body memory cell, and/or architecture, layout, structure and/or configuration employing such electrically floating body memory cells. In this regard, an electrically floating body transistor, which is programmed to a logic low or State "0" according to the techniques of the present inventions, may be implemented in the memory cell, architecture, layout, structure and/or configuration described and illustrated in the following provisional and non-provisional U.S. patent applications:

(1) application Ser. No. 10/450,238, which was filed by Fazan et al. on Jun. 10, 2003 and entitled "Semiconductor Device";

(2) application Ser. No. 10/487,157, which was filed by Fazan et al. on Feb. 18, 2004 and entitled "Semiconductor Device";

(3) application Ser. No. 10/829,877, which was filed by Ferrant et al. on Apr. 22, 2004 and entitled "Semiconductor Memory Cell, Array, Architecture and Device, and Method of Operating Same";

(4) application Ser. No. 10/840,009, which was filed by Ferrant et al. on May 6, 2004 and entitled "Semiconductor Memory Device and Method of Operating Same";

(5) application Ser. No. 10/941,692, which was filed by Fazan et al. on Sep. 15, 2004 and entitled "Low Power Programming Technique for a One Transistor SOI Memory Device & Asymmetrical Electrically Floating Body Memory Device, and Method of Manufacturing Same"; and (6) application Ser. No. 60/662,923, which was filed by Carman on Mar. 17, 2005 and entitled "Memory Device/Array Having Electrically Floating Body Memory Cells, and Method of Operating Same".

The entire contents of these U.S. patent applications, including, for example, the inventions, features, attributes, architectures, configurations, materials, techniques and advantages described and illustrated therein, are hereby incorporated by reference herein.

Notably, the memory cells may be controlled (for example, programmed or read) using any of the control circuitry described and illustrated in the above-referenced U.S. patent applications. For the sake of brevity, those discussions will not be repeated; such control circuitry is incorporated herein by reference. Indeed, all such control/selection techniques and circuitry therefor, whether now known or later developed, are intended to fall within the scope of the present inventions.

For example, the data stored in (or write the data into) memory cells 12 of DRAM array/device 10 may be read using many well known circuitry and techniques, including those described in the above-referenced U.S. patent applications. The present inventions may also employ the read circuitry and techniques described and illustrated in U.S. patent application Ser. No. 10/840,902, which was filed by Portmann et al. on May 7, 2004, and entitled "Reference Current Generator, and Method of Programming, Adjusting and/or Operating Same".

In addition, the present inventions may employ the read operation techniques described and illustrated in U.S. Provisional Patent Application Ser. No. 60/718,417, which was filed by Bauser on Sep. 19, 2005, and entitled "Method and Circuitry to Generate a Reference Current for Reading a Memory Cell Having an Electrically Floating Body Transistor, and Device Implementing Same". The entire contents of the U.S. Provisional Patent Application Ser. No. 60/718,417 are incorporated herein by reference.

Moreover, a sense amplifier (not illustrated) may be employed to read the data stored in memory cells 12. The sense amplifier may sense the data state stored in memory cell 12 using voltage or current sensing techniques. In the context of a current sense amplifier, the current sense amplifier may compare the cell current to a reference current, for example, the current of a reference cell (not illustrated). From that comparison, it may be determined whether memory cell 12 contained a logic high (relatively more majority carries 34 contained within body region 18) or logic low data state (relatively less majority carries 28 contained within body region 18). Such circuitry and configurations thereof are well known in the art.

It should be further noted that while each memory cell 12 in the exemplary embodiments (described above) includes one transistor 14, memory cell 12 may include two transistors, as described and illustrated in application Ser. No. 10/829,877, which was filed by Ferrant et al. on Apr. 22, 2004 and entitled "Semiconductor Memory Cell, Array, Architecture and Device, and Method of Operating Same". In this regard, with reference to FIG. 8, two-transistor memory cell 12 includes transistors 14a and 14b which store complementary data states. In one embodiment, transistors 14a and 14b of memory cell 12 include a layout whereby transistors 14a and 14b include (1) common source regions 20a and 20b, respectively, and (2) gates 16a and 16b, respectively, which are connected to the same word line 28.

With reference to FIGS. 9A and 9B, in operation, two-transistor memory cell 12 includes first transistor 14a that maintains a complementary state relative to second transistor 14b. As such, when programmed, one of the transistors of the memory cell stores a logic low (a binary "0") and the other transistor of the memory cell stores a logic high (a binary "1"). The transistor 14 that is programmed to a logic low or State "0" may be programmed according to the techniques of the present inventions. Indeed, the transistors 14a or 14b of FIGS. 9A and 9B may be programmed using GIDL or GISL technique for writing or programming a logic high or State "1".

As mentioned above, any of the architectures, layouts, structures and/or configurations, as well as the programming and reading operations described and illustrated in application Ser. No. 10/829,877, which was filed by Ferrant et al. on Apr. 22, 2004 and entitled "Semiconductor Memory Cell, Array, Architecture and Device, and Method of Operating Same" may be employed in conjunction with the inventions described and illustrated herein. For the sake of brevity, those discussions will not be repeated; rather, they are incorporated by reference herein.

The electrically floating memory cells, transistors and/or memory array(s) may be fabricated using well known techniques and/or materials. Indeed, any fabrication technique and/or material, whether now known or later developed, may be employed to fabricate the electrically floating memory cells, transistors and/or memory array(s). For example, the present inventions may employ silicon (whether bulk-type or SOI, as described above), germanium, silicon/germanium, and gallium arsenide or any other semiconductor material in which transistors may be formed. Indeed, the electrically floating memory cells, transistors and/or memory array(s) may employ the techniques described and illustrated in non-provisional patent application entitled "Integrated Circuit Device, and Method of Fabricating Same", which was filed on Jul. 2, 2004, by Fazan, and assigned Ser. No. 10/884,481 (hereinafter "Integrated Circuit Device Patent Application"). The entire contents of the Integrated Circuit Device Patent Application, including, for example, the inventions, features, attributes, architectures, configurations, materials, techniques and advantages described and illustrated therein, are hereby incorporated by reference herein.

Indeed, memory array 10 (including SOI memory transistors) may be integrated with SOI logic transistors, as described and illustrated in the Integrated Circuit Device Patent Application. For example, in one embodiment, an integrated circuit device includes memory section (having, for example, PD or FD SOI memory transistors 14) and logic section having, for example, high performance transistors, such as Fin-FET, multiple gate transistors, and/or non-high performance transistors (for example, single gate transistors that do not possess the performance characteristics of high performance transistors—not illustrated). Again, the entire contents of the Integrated Circuit Device Patent Application, including, for example, the inventions, features, attributes, architectures, configurations, materials, techniques and advantages described and illustrated therein, are hereby incorporated by reference.

Further, the memory arrays may be comprised of N-channel, P-channel and/or both types of transistors, as well as partially depleted and/or fully depleted type transistors. For example, circuitry that is peripheral to the memory array (for example, sense amplifiers or comparators, row and column address decoders, as well as line drivers (not illustrated herein)) may include fully depleted type transistors (whether P-channel and/or N-channel type). Alternatively, such circuitry may include partially depleted type transistors (whether P-channel and/or N-channel type). There are many techniques to integrate both partially depleted and/or fully depleted type transistors on the same substrate (see, for example, application Ser. No. 10/487,157, which was filed by Fazan et al. on Feb. 18, 2004 and entitled "Semiconductor Device"). All such techniques, whether now known or later developed, are intended to fall within the scope of the present inventions.

Notably, electrically floating body transistor 14 may be a symmetrical or non-symmetrical device. Where transistor 14 is symmetrical, the source and drain regions are essentially interchangeable. However, where transistor 14 is a non-symmetrical device, the source or drain regions of transistor 14 have different electrical, physical, doping concentration and/or doping profile characteristics. As such, the source or drain regions of a non-symmetrical device are typically not interchangeable. This notwithstanding, the drain region of the electrically floating N-channel type transistor of the memory cell (whether the source and drain regions are interchangeable or not) is that region of the transistor that is connected to the bit line/sense amplifier.

There are many inventions described and illustrated herein. While certain embodiments, features, attributes and advantages of the inventions have been described and illustrated, it should be understood that many others, as well as different and/or similar embodiments, features, attributes and advantages of the present inventions, are apparent from the description and illustrations. As such, the embodiments, features, attributes and advantages of the inventions described and illustrated herein are not exhaustive and it should be understood that such other, similar, as well as different, embodiments, features, attributes and advantages of the present inventions are within the scope of the present inventions.

For example, as mentioned above, the illustrated voltage levels to implement the write and read operations are exemplary. The indicated voltage levels may be relative or absolute. That is, for example, a logic low may be written into transistor 12a (see, for example, FIG. 5B) using the voltages indicated therein. Alternatively, the voltages indicated may be relative in that each voltage level, for example, may be increased or decreased by a given voltage amount (for example, each voltage may be increased by 0.25 or 0.5 volts) whether one or more of the voltages (for example, the source, drain or gate voltages) become or are positive and negative.

As mentioned above, each of the aspects of the present inventions, and/or embodiments thereof, may be employed alone or in combination with one or more of such aspects and/or embodiments. For the sake of brevity, those permutations and combinations will not be discussed separately herein. As such, the present inventions are neither limited to any single aspect (nor embodiment thereof), nor to any combinations and/or permutations of such aspects and/or embodiments.

Moreover, the above embodiments of the present inventions are merely exemplary embodiments. They are not intended to be exhaustive or to limit the inventions to the precise forms, techniques, materials and/or configurations disclosed. Many modifications and variations are possible in light of the above teaching. It is to be understood that other embodiments may be utilized and operational changes may be made without departing from the scope of the present inventions. As such, the foregoing description of the exemplary embodiments of the inventions has been presented for the purposes of illustration and description. Many modifications and variations are possible in light of the above teaching. It is intended that the scope of the inventions not be limited solely to the description above.

What is claimed is:

1. An integrated circuit comprising:
   a semiconductor memory cell comprising an electrically floating body transistor comprising:
      a source region;
      a drain region;
      a body region disposed between the source region and the drain region, wherein the body region is electrically floating; and
      a gate disposed over the body region and separated therefrom by a gate dielectric; and
      wherein the memory cell includes:
         a first data state representative of a first charge in the body region; and
         a second data state representative of a second charge in the body region wherein the second charge is substantially provided by removing carriers from the body region through the gate; and
   control circuitry, coupled to the memory cell, to generate control signals, including first control signals, to program one of a plurality of data states into the memory cell, wherein, in response to the first control signals applied to the memory cell, the electrically floating body transistor provides the second charge in the body region by removing carriers from the body region through the gate.

2. The integrated circuit of claim 1 wherein the first charge comprises an accumulation of majority carriers in the body region of the transistor.

3. The integrated circuit of claim 1 wherein the second charge is provided in the body region by applying (i) positive voltages to the drain region and source region, and (ii) a negative voltage to the gate.

4. The integrated circuit of claim 1 wherein positive voltages are applied to the drain region and source region to substantially remove at least all carriers of the first charge from the body region through the gate of the transistor.

5. The integrated circuit of claim 1 wherein, in response to the first control signals applied to the gate, drain region and source region, the second charge is substantially provided in the body region by causing, forcing and/or inducing majority carriers in the body region to tunnel through the gate dielectric to the gate of the transistor.

6. The integrated circuit of claim 1 wherein the control circuitry generates second control signals to program the first data state into the memory cell, wherein, in response to the second control signals applied to the memory cell, the electrically floating body transistor provides the first charge in the body region of the electrically floating body transistor, wherein the first charge is provided in the body region via impact ionization or band-to-band tunneling phenomenon.

7. The integrated circuit of claim 1 wherein negative voltages are applied to the drain region and source region and a positive voltage is applied to the gate to provide the second charge in the body region of the transistor.

8. An integrated circuit comprising:
a semiconductor memory cell array comprising a plurality of dynamic random access memory cells arranged in a matrix of rows and columns, each dynamic random access memory cell comprises a transistor, each transistor comprises:
a source region;
a drain region;
a body region disposed between the source region and the drain region, wherein the body region is electrically floating; and
a gate disposed over the body region and separated therefrom by a gate dielectric; and
wherein each dynamic random access memory cell includes:
a first data state representative of a first charge in the body region of the associated transistor; and
a second data state representative of a second charge in the body region of the associated transistor wherein the second charge is substantially provided by removing carriers from the body region through the gate of the associated transistor; and
control circuitry, coupled to the dynamic random access memory cells, to generate control signals, including first control signals, to program one of a plurality of data states into the memory cells, wherein, in response to first control signals applied to a first plurality of memory cells, the electrically floating body transistor associated with each memory cell of the first plurality of memory cells provides the second charge in the corresponding body region.

9. The integrated circuit of claim 8 wherein a first row of dynamic random access memory cells is adjacent to (i) a second row of dynamic random access memory cells and (ii) a third row of dynamic random access memory cells wherein the source region of the transistor of each memory cell corresponding to the first row of dynamic random access memory cells is connected to a first source line, and wherein the gate of the transistor of each memory cell corresponding to the first row of dynamic random access memory cells is connected to a first word line.

10. The integrated circuit of claim 9 wherein the source region of the transistor of each memory cell corresponding to the second raw of dynamic random access memory cells is connected to the first source line, and wherein the gate of the transistor of each memory cell corresponding to the second row of dynamic random access memory cells is connected to a second word line.

11. The integrated circuit of claim 9 wherein the source region of the transistor of each memory cell corresponding to the second row and the third row of dynamic random access memory cells is connected to a second source line and third source line, respectively, and wherein the gate of the transistor of each memory cell corresponding to the second row and the third row of dynamic random access memory cells is connected to a second word line and a third word line, respectively.

12. The integrated circuit of claim 11 wherein the drain region of the transistor of each memory cell corresponding to the first row of dynamic random access memory cells is the same region as the drain region of the transistor of an adjacent memory cell of the third row of dynamic random access memory cells.

13. The integrated circuit of claim 8 wherein a memory cell of the semiconductor memory cell array is programmed to the second data state by the control circuitry by applying (i) a positive voltage to the drain region of the associated transistor, (ii) a positive voltage to the source region of the associated transistor, and (iii) a negative voltage to the gate of the associated transistor.

14. The integrated circuit of claim 13 wherein in response to (i) the positive voltage to the drain region of the associated transistor, (ii) the positive voltage to the source region of the associated transistor, and (iii) the negative voltage to the gate of the associated transistor, the second charge is substantially provided in the body region of the associated transistor by causing, forcing and/or inducing majority carriers in the floating body of the associated transistor to tunnel through the gate dielectric to the gate of the associated transistor.

15. The integrated circuit of claim 8 wherein the control circuitry generates second control signals to program the first data state into at least one memory cell, wherein, the transistor associated with the at least one memory cell, in response to the second control signals applied to the at least one memory cell, provides the first charge in the electrically floating body region associated therewith via impact ionization or band-to-band tunneling phenomenon.

16. The integrated circuit of claim 8 wherein a memory cell of the semiconductor memory cell array is programmed to the second data state by the control circuitry by applying (i) a negative voltage to the drain region of the associated transistor, (ii) a negative voltage to the source region of the associated transistor, and (iii) a positive voltage to the gate of the associated transistor.

17. An integrated circuit comprising:
semiconductor memory cell comprising an electrically floating body transistor, disposed in or on a semiconductor region or layer which resides on or above an insulating region or layer of a substrate, the electrically floating body transistor comprising:

a first region having impurities to provide a first conductivity type;

a second region having impurities to provide the first conductivity type, a body region disposed between the first region, the second region and the insulating region or layer of the substrate, wherein the body region is electrically floating and includes impurities to provide a second conductivity type wherein the second conductivity type is different from the first conductivity type;

a gate spaced apart from the body region and separated therefrom by a gate dielectric; and wherein the memory cell includes:
   a first data state representative of a first charge in the body region of the transistor; and
   a second data state representative of a second charge in the body region wherein the second charge is substantially provided by removing carriers from the body region through the gate; and control circuitry, coupled to the memory cell, to generate control signals, including first control signals, to program one of a plurality of data states into the memory cell, wherein, in response to the first control signals applied to the memory cell, the electrically floating body transistor provides the second charge in the body region of the electrically floating body transistor by removing carriers from the body region through the gate.

18. The integrated circuit of claim 17 wherein the first charge in the body region of the transistor of the memory cell comprises an accumulation of majority carriers and wherein positive voltages are applied to the drain region and source region to substantially remove carriers of at least the first charge from the body region of the transistor through the gate of the transistor.

19. The integrated circuit of claim 17 wherein, in response to the first control signals applied to the gate, drain region and source region of the transistor of the memory cell, the second charge is substantially provided in the body region of the transistor by causing, forcing and/or inducing majority carriers in the body region to tunnel through the gate dielectric to the gate of the transistor.

20. The integrated circuit of claim 17 wherein the control circuitry generates second control signals to program the first data state into the memory cell, wherein, in response to the second control signals applied to the memory cell, the transistor provides the first charge in the body region of the transistor, wherein the first charge is provided in the body region of the transistor of the memory cell via impact ionization or band-to-band tunneling phenomenon.

21. The integrated circuit of claim 17 wherein the memory cell consists essentially of the electrically floating body transistor.

22. The integrated circuit of claim 1 wherein the memory cell consists essentially of the electrically floating body transistor.

23. The integrated circuit of claim 8 wherein each dynamic random access memory cell consists essentially of the transistor.

24. The integrated circuit of claim 17 wherein the control circuitry includes means for generating the control signals to program one of a plurality of data states into the memory cell.

25. The integrated circuit of claim 1 wherein the control circuitry includes means for generating the control signals to program one of a plurality of data states into the memory cell.

26. The integrated circuit of claim 8 wherein the control circuitry includes means for generating the control signals to program one of a plurality of data states into the memory cells.

* * * * *